US011233190B2

(12) United States Patent
Ikeuchi et al.

(10) Patent No.: US 11,233,190 B2
(45) Date of Patent: Jan. 25, 2022

(54) PIEZOELECTRIC TRANSFORMER

(71) Applicant: Murata Manufacturing Co., Ltd., Nagaokakyo (JP)

(72) Inventors: Shinsuke Ikeuchi, Nagaokakyo (JP); Yoichi Mochida, Nagaokakyo (JP); Kansho Yamamoto, Nagaokakyo (JP); Takuo Hada, Nagaokakyo (JP); Hideya Horiuchi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 584 days.

(21) Appl. No.: 16/273,191

(22) Filed: Feb. 12, 2019

(65) Prior Publication Data
US 2019/0172996 A1   Jun. 6, 2019

Related U.S. Application Data

(63) Continuation of application No. PCT/JP2017/027977, filed on Aug. 2, 2017.

(30) Foreign Application Priority Data

Aug. 24, 2016   (JP) .............................. JP2016-163958

(51) Int. Cl.
*H01L 41/257* (2013.01)
*H01L 41/047* (2006.01)
(Continued)

(52) U.S. Cl.
CPC .......... *H01L 41/257* (2013.01); *B06B 1/0611* (2013.01); *H01L 41/047* (2013.01);
(Continued)

(58) Field of Classification Search
CPC ... H01L 41/047; H01L 41/257; H01L 41/083; H01L 41/107; H01L 41/29
See application file for complete search history.

(56) References Cited

U.S. PATENT DOCUMENTS

| 4,985,926 A | 1/1991 | Foster |
| 6,577,043 B2 | 6/2003 | Tsukai et al. |

(Continued)

FOREIGN PATENT DOCUMENTS

| JP | H027584 A | 1/1990 |
| JP | 2000312129 A | 11/2000 |

(Continued)

OTHER PUBLICATIONS

International Search Report issued in PCT/JP2017/027977, dated Oct. 17, 2017.

(Continued)

*Primary Examiner* — Bryan P Gordon
(74) *Attorney, Agent, or Firm* — Arent Fox LLP

(57) ABSTRACT

A piezoelectric transformer that includes a vibration portion assembly having an output electrode, an output-side intermediate electrode, an input-side intermediate electrode, and an input electrode. The vibration portion assembly includes n vibration portions. The input electrode includes one to n input electrode pieces. The output electrode includes one to n output electrode pieces. Wiring lines are arranged such that voltages of opposite phases can be respectively applied to a first input electrode piece group of the input electrode pieces corresponding to odd-numbered vibration portions, and a second input electrode piece group of the input electrode pieces corresponding to even-numbered vibration portions. The second output electrode piece and the first output-side intermediate electrode piece are superposed with each other in the thickness direction. The first output electrode piece is not superposed with either of the first and second output-side intermediate electrode pieces in the thickness direction.

16 Claims, 19 Drawing Sheets

(51) Int. Cl.
*H01L 41/107* (2006.01)
*H02N 2/18* (2006.01)
*B06B 1/06* (2006.01)
*H01L 41/083* (2006.01)
*H01L 41/29* (2013.01)

(52) U.S. Cl.
CPC .......... *H01L 41/083* (2013.01); *H01L 41/107* (2013.01); *H01L 41/29* (2013.01); *H02N 2/18* (2013.01)

(56) References Cited

U.S. PATENT DOCUMENTS

| | | | |
|---|---|---|---|
| 8,026,779 | B2 | 9/2011 | Nakamura et al. |
| 8,978,469 | B2 | 3/2015 | Takaoka et al. |
| 9,142,753 | B2* | 9/2015 | Mizuno ................ B41J 2/14209 |
| 10,020,441 | B2 | 7/2018 | Asano |
| 10,224,896 | B2 | 3/2019 | Nishimura et al. |
| 2002/0030420 | A1 | 3/2002 | Tsukai et al. |
| 2009/0195330 | A1 | 8/2009 | Nakamura et al. |
| 2009/0200900 | A1* | 8/2009 | Nakai ................ H03H 9/1035 310/365 |
| 2012/0247207 | A1 | 10/2012 | Takaoka et al. |
| 2013/0134838 | A1* | 5/2013 | Yun ................ H01L 41/047 310/366 |
| 2015/0280104 | A1* | 10/2015 | Asano ................ H01L 41/107 310/339 |
| 2016/0329877 | A1 | 11/2016 | Nishimura et al. |
| 2017/0160147 | A1* | 6/2017 | Genmei ................ H01L 41/042 |
| 2018/0069168 | A1* | 3/2018 | Ikeuchi ................ H01L 41/09 |

FOREIGN PATENT DOCUMENTS

| | | |
|---|---|---|
| JP | 2002152006 A | 5/2002 |
| JP | 2002223145 A | 8/2002 |
| JP | 2009225503 A | 10/2009 |
| JP | 2010156704 A | 7/2010 |
| JP | 2012215518 A | 11/2012 |
| WO | 2007145290 A1 | 12/2007 |
| WO | 2014097681 A1 | 6/2014 |
| WO | 2015111503 A1 | 7/2015 |
| WO | 2015171224 A1 | 11/2015 |

OTHER PUBLICATIONS

Written Opinion of the International Searching Authority issued in PCT/JP2017/027977, dated Oct. 17, 2017.

* cited by examiner

PIEZOELECTRIC TRANSFORMER

CROSS REFERENCE TO RELATED APPLICATIONS

The present application is a continuation of International application No. PCT/JP2017/027977, filed Aug. 2, 2017, which claims priority to Japanese Patent Application No. 2016-163958, filed Aug. 24, 2016, the entire contents of each of which are incorporated herein by reference.

FIELD OF THE INVENTION

The present invention relates to a piezoelectric transformer.

BACKGROUND OF THE INVENTION

International Publication No. WO 2015/171224 (Patent Document 1) discloses an ultrasonic transducer that includes piezoelectric layers. In Patent Document 1, a vibration film is formed by stacking a multilayer structure consisting of two different piezoelectric layers on a substrate. In this ultrasonic transducer, a vibration mode is utilized that accompanies displacement in a direction perpendicular to a surface of the vibration film such that there is an anti-node at a center portion of the vibration film and a node at an outer peripheral portion of the vibration film.

Patent Document 1: International Publication No. WO 2015/171224

SUMMARY OF THE INVENTION

The device disclosed in Patent Document 1 is an ultrasonic transducer, and if a piezoelectric transformer were to be implemented by using the multilayer structure consisting of the piezoelectric layers included in the ultrasonic transducer (hereafter, "piezoelectric transformer"), a voltage would be applied to a second piezoelectric layer, the vibration film formed by the multilayer structure would be excited in a specific vibration mode, and a transformed voltage would be extracted from a first piezoelectric layer.

This voltage transformation operation is realized as a result of an input-side impedance and an output-side impedance being different from each other. Generally, if the input-side impedance is made to be lower than the output-side impedance, a boosted voltage can be obtained as an output voltage. If the input-side impedance is made to be higher than the output-side impedance, a lowered voltage can be obtained as the output voltage. If we call such a voltage boosting ratio or voltage lowering ratio a "transformation ratio", a larger transformation ratio can be realized as the ratio between the input and output impedances increases. For example, the transformation ratio can be increased up to a certain level by changing the film thickness, material, and electrode area of the piezoelectric body in the structure disclosed in Patent Document 1. However, freely changing the film thickness and material of the piezoelectric body is difficult in manufacturing due to the significant effects on quality and cost, and in reality, the easiest method is to change the electrode area.

However, the electrode area is a factor that strongly affects the conversion efficiency between electrical energy and mechanical energy, and an optimum electrode area exists at which the conversion efficiency is maximized. Therefore, there is a problem in that if the electrode area is changed with the aim of increasing the transformation ratio, the conversion efficiency may be degraded and consequently the power transmission efficiency of the piezoelectric transformer may be degraded.

Accordingly, an object of the present invention is to provide a piezoelectric transformer that can realize a high transformation ratio.

In order to achieve this object, a piezoelectric transformer according to the present invention includes a base and an upper layer that is supported by the base. The upper layer includes a vibration portion assembly corresponding to a part of the upper layer that is not superposed with the base. The vibration portion assembly includes an output electrode, an output-side intermediate electrode, an input-side intermediate electrode, and an input electrode which are arranged separated from each other in a thickness direction and sequentially arrayed in the thickness direction. When n is an integer greater than or equal to 3, the vibration portion assembly includes n vibration portions arrayed in a first direction. The upper layer includes a first piezoelectric layer interposed between the output electrode and the output-side intermediate electrode in at least the n vibration portions and a second piezoelectric layer superposed with the first piezoelectric layer and interposed between the input-side intermediate electrode and the input electrode in at least the n vibration portions. The input electrode includes one to n input electrode pieces that are arrayed so as to correspond to at least one vibration portion among the n vibration portions. The output electrode includes one to n output electrode pieces that are arrayed so as to correspond to at least one vibration portion among the n vibration portions. The output-side intermediate electrode includes one to n output-side intermediate electrode pieces that are arrayed so as to correspond to at least one vibration portion among the n vibration portions. The second piezoelectric layer is polarized in a fixed direction throughout the n vibration portions. Referring to the n vibration portions as first to nth vibration portions from a first side to a second side along the first direction, wiring lines are arranged such that, among the one to n input electrode pieces, voltages of opposite phases, with a potential of the input-side intermediate electrode serving as a reference potential, can be respectively applied to a first input electrode piece group of the input electrode pieces corresponding to odd-numbered vibration portions, and a second input electrode piece group of the input electrode pieces corresponding to even-numbered vibration portions belong. The first piezoelectric layer is polarized in a fixed direction throughout the n vibration portions. The one to n output electrode pieces include a first output electrode piece and a second output electrode piece that are electrically connected to each other. The one to n output-side intermediate electrode pieces include a first output-side intermediate electrode piece and a second output-side intermediate electrode piece that are electrically connected to each other. The second output electrode piece and the first output-side intermediate electrode piece are superposed with each other in the thickness direction. The first output electrode piece is not superposed with the first output-side intermediate electrode piece or the second output-side intermediate electrode piece in the thickness direction. The second output-side intermediate electrode piece is not superposed with the first output electrode piece or the second output electrode piece in the thickness direction.

According to the present invention, the potential difference generated by a chain of sets of output-side intermediate electrode pieces and output electrode pieces is large, and therefore a large voltage can be obtained as an output voltage. In other words, a high transformation ratio can be realized.

DETAILED DESCRIPTION OF THE PREFERRED EMBODIMENTS

Figure 1:
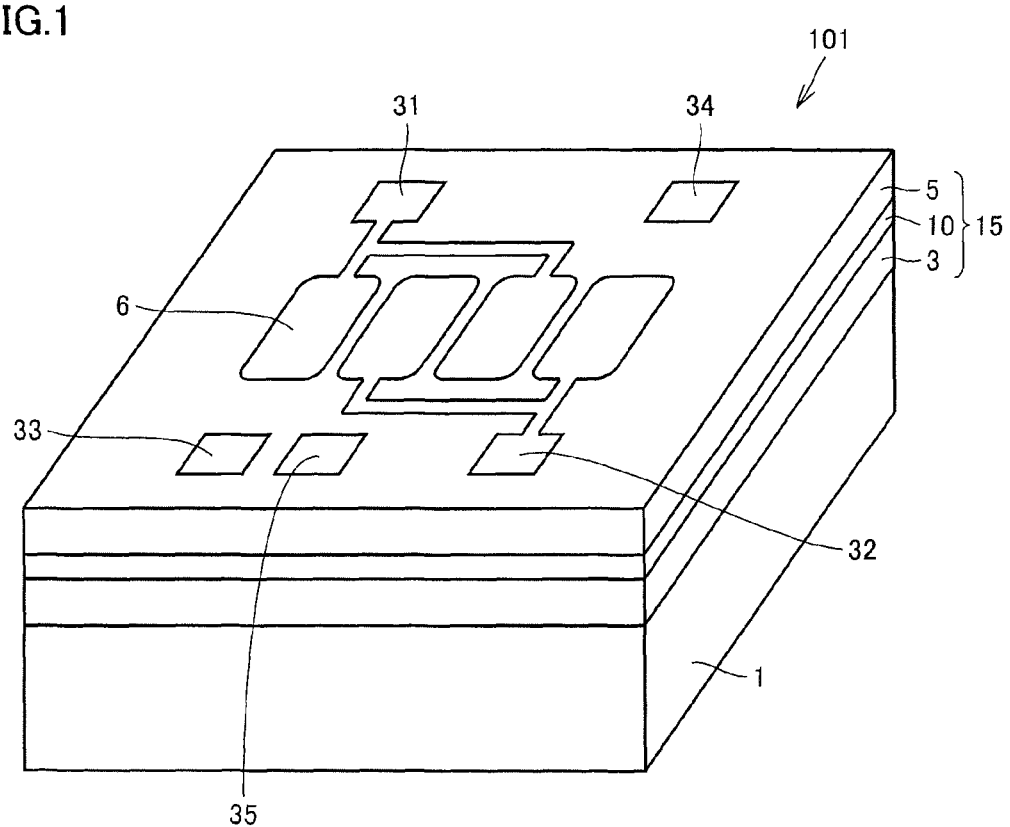
FIG. 1 is a perspective view of a piezoelectric transformer of embodiment 1 of the present invention.

The dimensional ratios depicted in the drawings do not necessarily accurately depict the actual dimensional ratios, and the dimensional ratios in the drawings may be depicted in an exaggerated manner for convenience of explanation. In the following description, when reference is made to the concepts of above and below, the meanings of these terms are not limited to meaning absolutely above and below, and may mean relatively above and below within the illustrated states.

Embodiment 1

Figure 2:
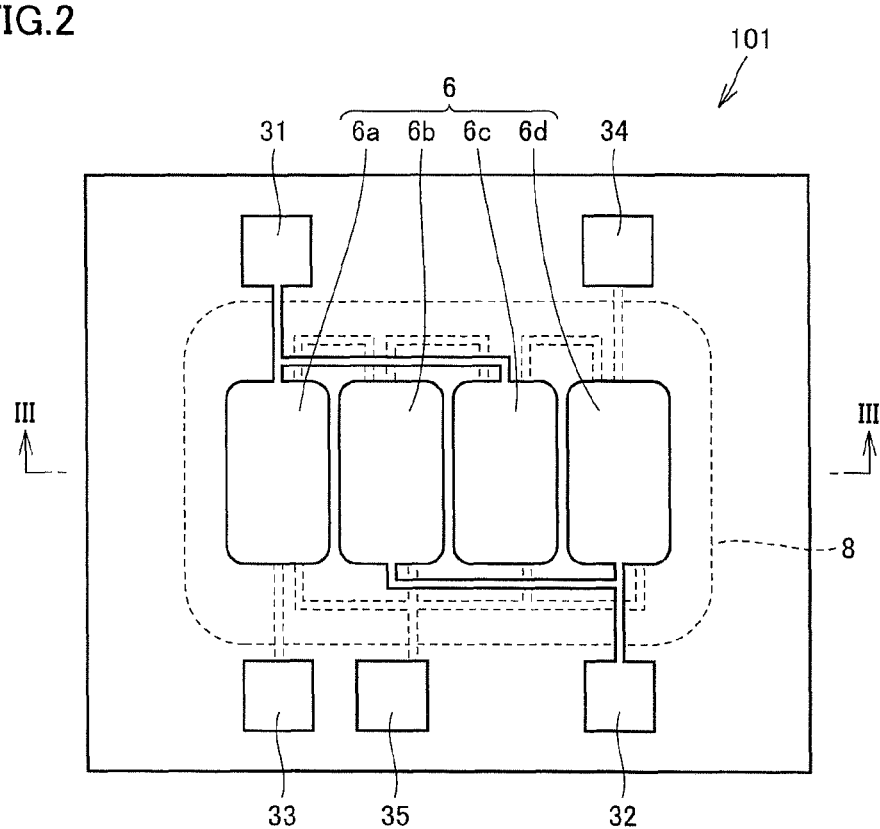
FIG. 2 is a plan view of the piezoelectric transformer of embodiment 1 of the present invention.
Figure 3:
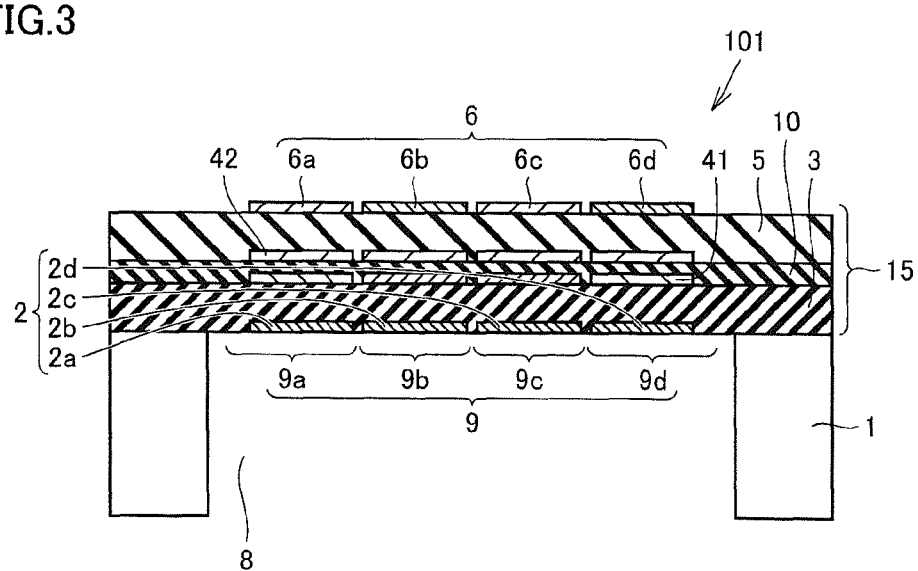
FIG. 3 is a sectional view looking in the direction of arrows and taken along line III-III in FIG. 2.
Figure 4:
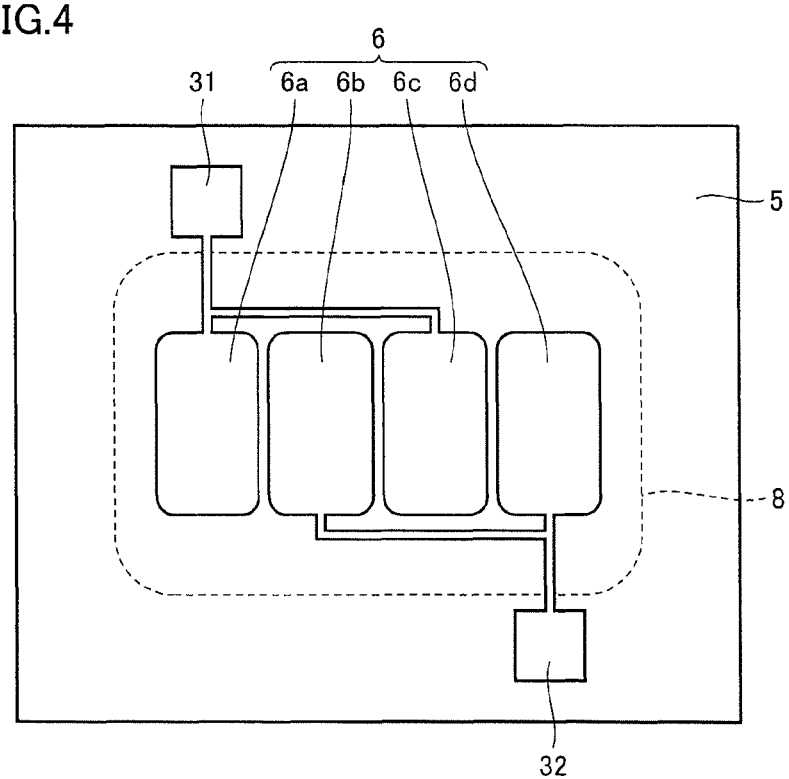
FIG. 4 is a first diagram illustrating the layout of layers included in the piezoelectric transformer of embodiment 1 of the present invention.
Figure 6:
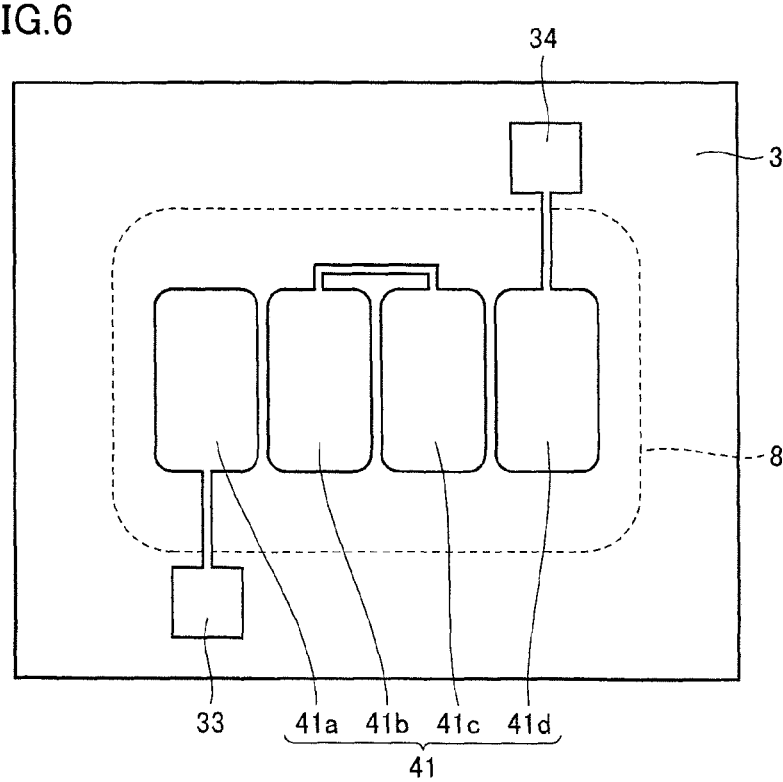
FIG. 6 is a third diagram illustrating the layout of layers included in the piezoelectric transformer of embodiment 1 of the present invention.
Figure 7:
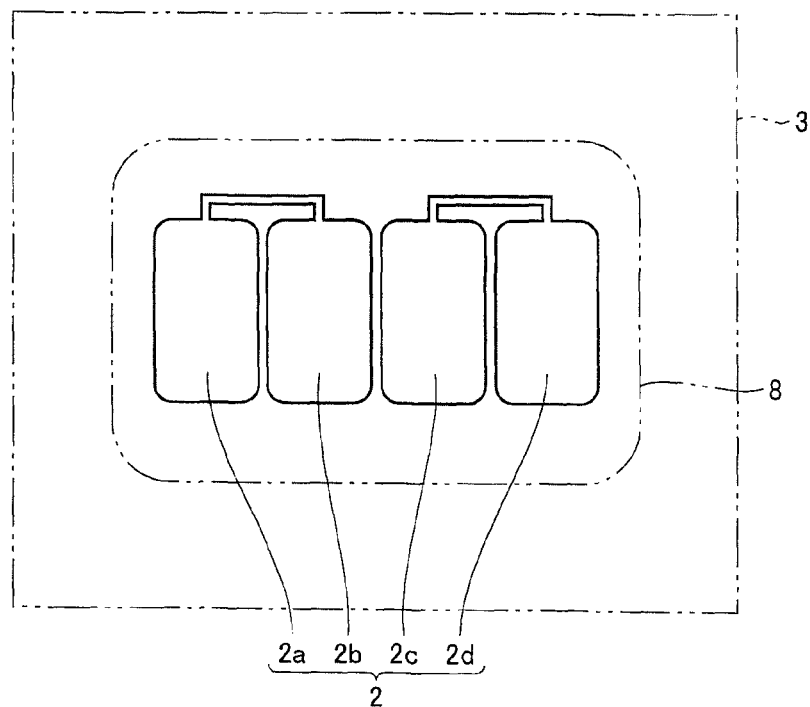
FIG. 7 is a fourth diagram illustrating the layout of layers included in the piezoelectric transformer of embodiment 1 of the present invention.
Figure 8:
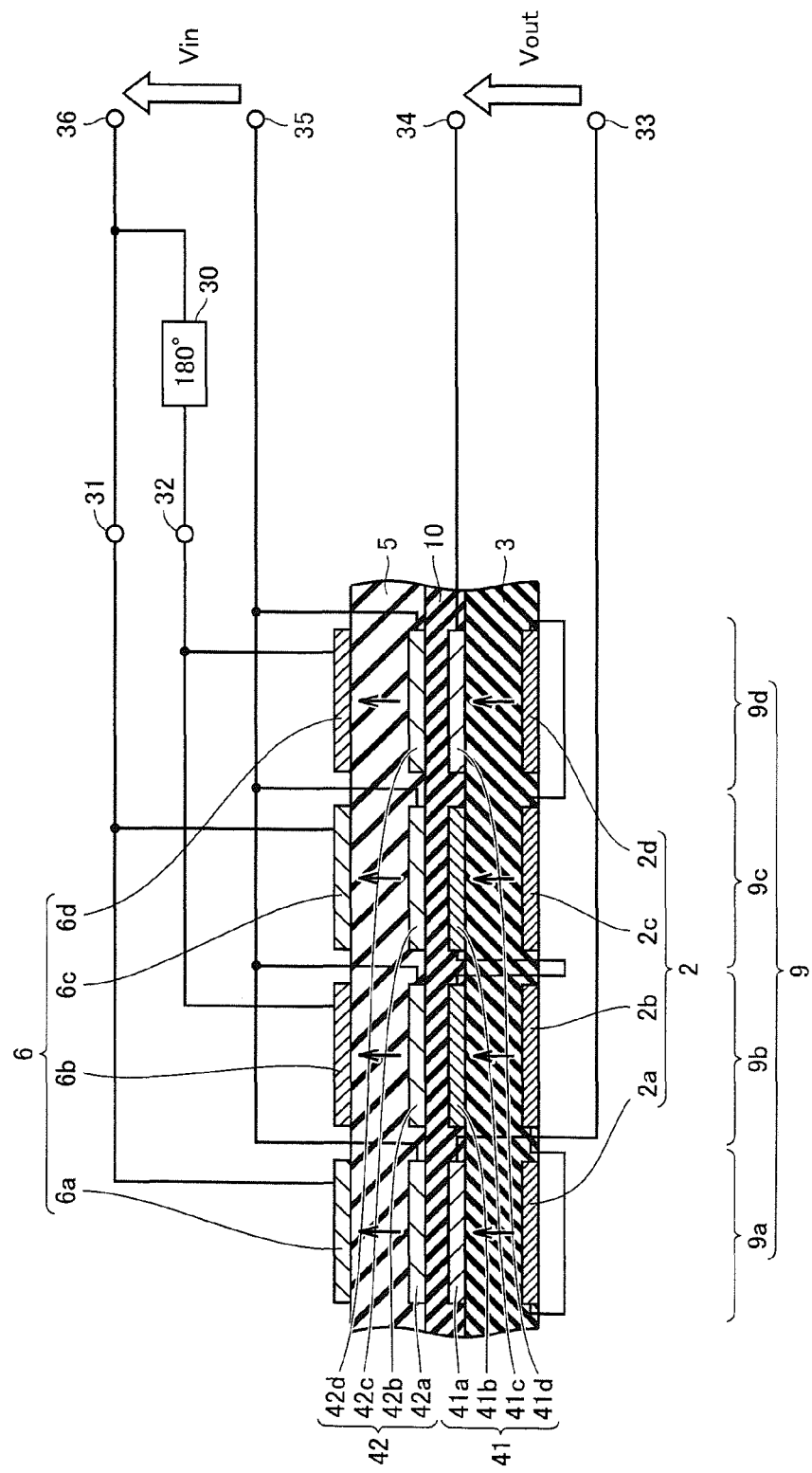
FIG. 8 is a conceptual diagram illustrating the vicinity of a vibration film of the piezoelectric transformer of embodiment 1 of the present invention.

A piezoelectric transformer according to embodiment 1 of the present invention will be described while referring to FIGS. 1 to 8. FIG. 1 illustrates the exterior of a piezoelectric transformer 101 of this embodiment. FIG. 2 illustrates a plan view of the piezoelectric transformer 101. FIG. 3 illustrates a sectional view looking in the direction of the arrows and taken along line III-III in FIG. 2. FIGS. 4 to 7 illustrate the layouts of conductor patterns and so forth of layers included in the piezoelectric transformer 101. FIG. 8 illustrates a conceptual diagram in which a vibration film of the piezoelectric transformer 101 is illustrated together with related wiring lines.

As illustrated in FIG. 1, the piezoelectric transformer 101 includes a base 1 and an upper layer 15 that is supported by the base 1. The base 1 may be a member composed of Si, for example. The base 1 is not limited to being a plate-shaped member, and may be formed using a plate-shaped member. For example, the base 1 may be formed using a Si substrate. As illustrated in FIG. 3, the upper layer 15 includes a vibration portion assembly 9, which is constituted by the part of the upper layer 15 that is not superposed with the base 1. The vibration portion assembly 9 includes an output electrode 2, an output-side intermediate electrode 41, an input-side intermediate electrode 42, and an input electrode 6, which are arranged so as to be separated from each other in a thickness direction and so as to be sequentially arrayed in the thickness direction. In the example illustrated here, the output electrode 2, the output-side intermediate electrode 41, the input-side intermediate electrode 42, and the input electrode 6 are arrayed in this order from the side close to the base 1, but this order may be reversed. The vibration portion assembly 9 includes n vibration portions 9a to 9d arrayed in one direction, where n is an integer greater than or equal to 3. Here, for convenience of explanation, it will be assumed that n=4 in the following description, but this is merely an example and n may be an integer other than 4. The upper layer 15 includes a first piezoelectric layer 3 that is arranged so that a part thereof is interposed between the output electrode 2 and the output-side intermediate electrode 41 in at least the n vibration portions 9a to 9d; and a second piezoelectric layer 5 that is arranged so as to be superposed with the first piezoelectric layer 3 and is arranged so that a part thereof is interposed between the input-side intermediate electrode 42 and the input electrode 6 in at least the n vibration portions 9a to 9d. The input electrode 6 includes one to n input electrode pieces 6a to 6d that are arrayed so as to correspond to at least one vibration portion among the n vibration portions 9a to 9d. The output electrode 2 includes one to n output electrode pieces 2a to 2d that are arrayed so as to correspond to at least one vibration portion among the n vibration portions 9a to 9d. The input-side intermediate electrode 42 includes one to n input-side intermediate electrode pieces 42a to 42d that are arrayed so as to correspond to at least one vibration portion among the n vibration portions 9a to 9d. The output-side intermediate electrode 41 includes one to n output-side intermediate electrode pieces 41a to 41d that are arrayed so as to correspond to at least one vibration portion among the n vibration portions 9a to 9d.

As illustrated in FIG. 8, the second piezoelectric layer 5 is polarized in a fixed direction throughout the n vibration portions 9a to 9d. The first piezoelectric layer 3 is also polarized in a fixed direction throughout the n vibration portions 9a to 9d. The arrows illustrated inside the first piezoelectric layer 3 and the second piezoelectric layer 5 in FIG. 8 indicate the direction of polarization.

Referring to the n vibration portions as first to nth vibration portions from one side to another side along the one direction, wiring lines are routed such that voltages of opposite phases, with a potential of the input-side intermediate electrode 42 serving as a reference potential, can be respectively applied to a first input electrode piece group, which is a group to which one or more of the input electrode pieces corresponding to the odd-numbered vibration portions belong, and a second input electrode piece group, which is a group to which one or more of the input electrode pieces corresponding to the even-numbered vibration portions belong.

The one to n output electrode pieces 2a to 2d include a first output electrode piece and a second output electrode piece that are electrically connected to each other. Here, as illustrated in FIGS. 7 and 8, for example, the output electrode piece 2a and the output electrode piece 2b are electrically connected to each other, and therefore the output electrode piece 2a corresponds to the first output electrode piece and the output electrode piece 2b corresponds to the second output electrode piece.

The one to n output-side intermediate electrode pieces 41a to 41d include a first output-side intermediate electrode piece and a second output-side intermediate electrode piece that are electrically connected to each other. Here, as illustrated in FIGS. 6 and 8, for example, the output-side intermediate electrode piece 41b and the output-side intermediate electrode piece 41c are electrically connected to each other, and therefore the output-side intermediate electrode piece 41b can be regarded as the first output-side intermediate electrode piece and the output-side intermediate electrode piece 41c can be regarded as the second output-side intermediate electrode piece.

The output electrode piece 2b serving as the second output electrode piece and the output-side intermediate electrode piece 41b serving as the first output-side intermediate electrode piece are superposed with each other in the thickness direction. The output electrode piece 2a serving as the first output electrode piece is not superposed with the output-side intermediate electrode piece 41b serving as the first output-side intermediate electrode piece or the output-side intermediate electrode piece 41c serving as the second output-side intermediate electrode piece in the thickness direction. The output-side intermediate electrode piece 41c serving as the second output-side intermediate electrode piece is not superposed with the output electrode piece 2a serving as the first output electrode piece or the output electrode piece 2b serving as the second output electrode piece in the thickness direction.

The piezoelectric transformer 101 is configured to be used by inputting voltages of opposite phases to pad electrodes 31 and 32 while using a potential supplied to a pad electrode 35 as a reference potential. The piezoelectric transformer itself may be provided with a mechanism for making the voltages input to the pad electrodes 31 and 32 have opposite phases from each other. Alternatively, the mechanism for making the input voltages have opposite phases from each other may not be included in the piezoelectric transformer 101 and may instead be prepared separately by the user.

Next, a manufacturing method for obtaining the piezoelectric transformer 101 will be described.

A Mo film is deposited on the surface of a Si substrate, which serves as the base 1, so as to have a thickness of 100 nm, and the Mo film is then subjected to patterning. As a result, the output electrode 2 is formed. Before forming the output electrode 2, an output electrode protective film (not illustrated) may be formed by depositing an AlN film. The output electrode protective film is a protective film formed so as to cover the output electrode 2 in one piece from below in FIG. 3. An example is illustrated in FIG. 3 in which there is no output electrode protective film.

An AlN film is deposited as the first piezoelectric layer 3 so as to cover the output electrode 2 from above using a sputtering method such that the AlN film has a thickness of 1000 nm. Next, a Mo film is deposited with a thickness of 100 nm so as to cover the first piezoelectric layer 3, and the Mo film is then subjecting to patterning. The output-side intermediate electrode 41 is thus obtained. In addition, an AlN film is deposited as an intermediate insulating layer 10 so as to have a thickness of 1000 nm using a sputtering method so as to cover the output-side intermediate electrode 41.

A Pt film is deposited so as to have a thickness of 100 nm, and the Pt film is then subjected to patterning. An adhesive layer may be formed between the Pt film and the AlN film constituting the first piezoelectric layer 3. Thus, the input-side intermediate electrode 42 is formed of the patterned Pt film.

Next, a PZT film is deposited as the second piezoelectric layer 5 using a sputtering method or a sol gel method so as to have a thickness of 1200 nm. After that, a Au film with a thickness of 100 nm is deposited so as to cover the second piezoelectric layer 5 and the Au film is then subjected to patterning. An adhesive layer may be formed between the Au film and the PZT film serving as the second piezoelectric layer 5. Thus, the input electrode 6 is formed of the patterned Au film.

Next, the first piezoelectric layer 3, the intermediate insulating layer 10, and the second piezoelectric layer 5 are subjected to etching in order to expose parts where pad electrodes will be formed that are to be respectively connected to the output electrode 2, the output-side intermediate electrode 41, and the input-side intermediate electrode 42. Pad electrodes 33 and 34 are connected to the output-side intermediate electrode 41 by wiring lines. In this embodiment, the output-side intermediate electrode 41 is divided into the one to n output-side intermediate electrode pieces 41*a* to 41*d* and a wiring line is connected from the pad electrode 33 to the output-side intermediate electrode piece 41*a*. A wiring line is connected from the pad electrode 34 to the output-side intermediate electrode piece 41*d*. The output-side intermediate electrode piece 41*b* and the output-side intermediate electrode piece 41*c* are electrically connected to each other. The pad electrode 35 is connected to the input-side intermediate electrode 42 by wiring lines. In this embodiment, the input-side intermediate electrode 42 is divided into one to n input-side intermediate electrode pieces 42*a* to 42*d*, and wiring lines are individually connected from the pad electrode 35 to the one to n input-side intermediate electrode pieces 42*a* to 42*d*. The second piezoelectric layer 5 and the intermediate insulating layer 10 are subjected to etching in order to expose the pad electrodes 33 and 34. The second piezoelectric layer 5 is subjected to etching in order to expose the pad electrode 35. After that, Al films or the like are formed so as to cover the exposed pad electrodes at the parts where the pad electrodes are exposed.

Next, the base 1 is etched from the rear surface of the base 1 until the output electrode 2 and the first piezoelectric layer 3 are reached. At this time, if the above-mentioned output electrode protective film is present, progress of the etching can be easily stopped by the output electrode protective film. In this way, an opening 8 is formed in the base 1 and the remaining part above the opening 8 forms the vibration portion assembly 9. In the example described here, the opening 8 is formed as a through hole.

The piezoelectric transformer 101 having the structure illustrated in FIGS. 1 to 3 can be obtained as described above.

In the example described in this embodiment, the vibration portion assembly 9 is mainly formed of a multilayer structure consisting of the output electrode 2, the first piezoelectric layer 3, the output-side intermediate electrode 41, the input-side intermediate electrode 42, the second piezoelectric layer 5, and the input electrode 6, but in addition to these constituent components, an AlN film, a SiN film, a $SiO_2$ film, a $ZrO_2$ film or the like separately formed with a thickness of around 1000 nm may be stacked as a flexible film. In addition, a Si layer serving as an active layer may be used as a flexible film by using a SOI substrate or the like instead of a Si substrate in order to obtain the base 1. The thickness of the Si layer serving as an active layer in the SOI substrate may be 3-50 μm, for example, and the Si layer may be used as a flexible film without altering the thickness of the Si layer.

In the example described in this embodiment, the output electrode 2, the output-side intermediate electrode 41, the input-side intermediate electrode 42, and the input electrode 6, which are located in the vibration portion assembly 9, are each divided into four island-shaped parts. Here, the number of pieces that each of the output electrode 2, the output-side intermediate electrode 41, the input-side intermediate electrode 42, and the input electrode 6 is divided into is "4", but this is merely an example, and if the number n of vibration portions is changed, the number of pieces into which each of the output electrode 2, the output-side intermediate electrode 41, the input-side intermediate electrode 42, and the input electrode 6 is divided into can be changed to match this number. The number of divided pieces of each component may be another number as appropriate.

Furthermore, as illustrated in FIG. 2, adjacent electrodes of the input electrode 6 are electrically isolated from each other and an electrode piece and an electrode piece subsequent to the adjacent electrode piece are connected so as to be electrically conductive with each other via a wiring line. The one to n input electrode pieces 6*a* to 6*d* of the input electrode 6 are divided into two groups. In other words, the input electrode pieces 6*a* to 6*d* are divided into the first input electrode piece group consisting of the input electrode pieces 6*a* and 6*c* and the second input electrode piece group consisting of the input electrode pieces 6*b* and 6*d*. The input electrode pieces inside the same input electrode piece group are at the same electrical potential and different input electrode piece groups may be at different potentials.

The wiring lines are illustrated as solid lines and broken lines in FIG. 2 and are illustrated such that the positions of wiring lines located in different layers are slightly shifted from each other in order to make it easier to understand where the wiring lines extending from different pad electrodes are connected to. The shifted positions of the wiring lines are merely for convenience of explanation, and in reality, wiring lines located in different layers may have a positional relationship in which the wiring lines are superposed with one another when viewed from above. The electrical connection relationships of the wiring lines are also illustrated in FIGS. 4 to 8.

In this embodiment, as illustrated in FIG. 8, the first input electrode piece group is connected to an input terminal 36 of an alternating-current power supply and the second input electrode piece group is connected to the input terminal 36 via a phase inverter 30, with the potential of the input-side intermediate electrode 42 serving as a reference potential. Here, the input terminal 36 is provided separately from the pad electrodes 31 and 32, but the phase inverter 30 may instead be included in the piezoelectric transformer 101. In this case, a phase-inverting function may be provided between the pad electrode 31 and the first input electrode piece group or between the pad electrode 32 and the second input electrode piece group. If a phase-inverting function is provided at either these locations, a configuration can be adopted in which input voltages Vin of the same phase supplied from an alternating-current power supply are simply connected to both the pad electrodes 31 and 32 and the phase of one of these input voltages Vin is inverted.

In this embodiment, an output voltage Vout can be extracted from between the pad electrodes 33 and 34.

In the example illustrated here, the input-side intermediate electrode 42 includes the one to n input-side intermediate electrode pieces 42*a* to 42*d* that are arrayed so as to correspond to at least one vibration portion among the n vibration portions 9*a* to 9*d*, but the input-side intermediate electrode 42 may instead be constituted by a single electrode that covers all of the n vibration portions 9*a* to 9*d* in one piece.

For example, in FIG. 8, it is illustrated that the output-side intermediate electrode piece 41*b* and the output-side intermediate electrode piece 41*c* are separate electrode pieces and are electrically connected to each other by a wiring line, but the present invention is not limited to this configuration.

Rather than providing electrode pieces that are electrically connected to each other so as to be at the same potential as divided electrode pieces that individually correspond to the vibration portions, an integrated electrode piece that extends across a plurality of vibration portions may be provided instead.

Similarly for the output electrode, electrode pieces that are electrically connected to each other so as to be at the same potential may instead be provided as an integrated electrode piece that extends across a plurality of vibration portions.

Figure 30:
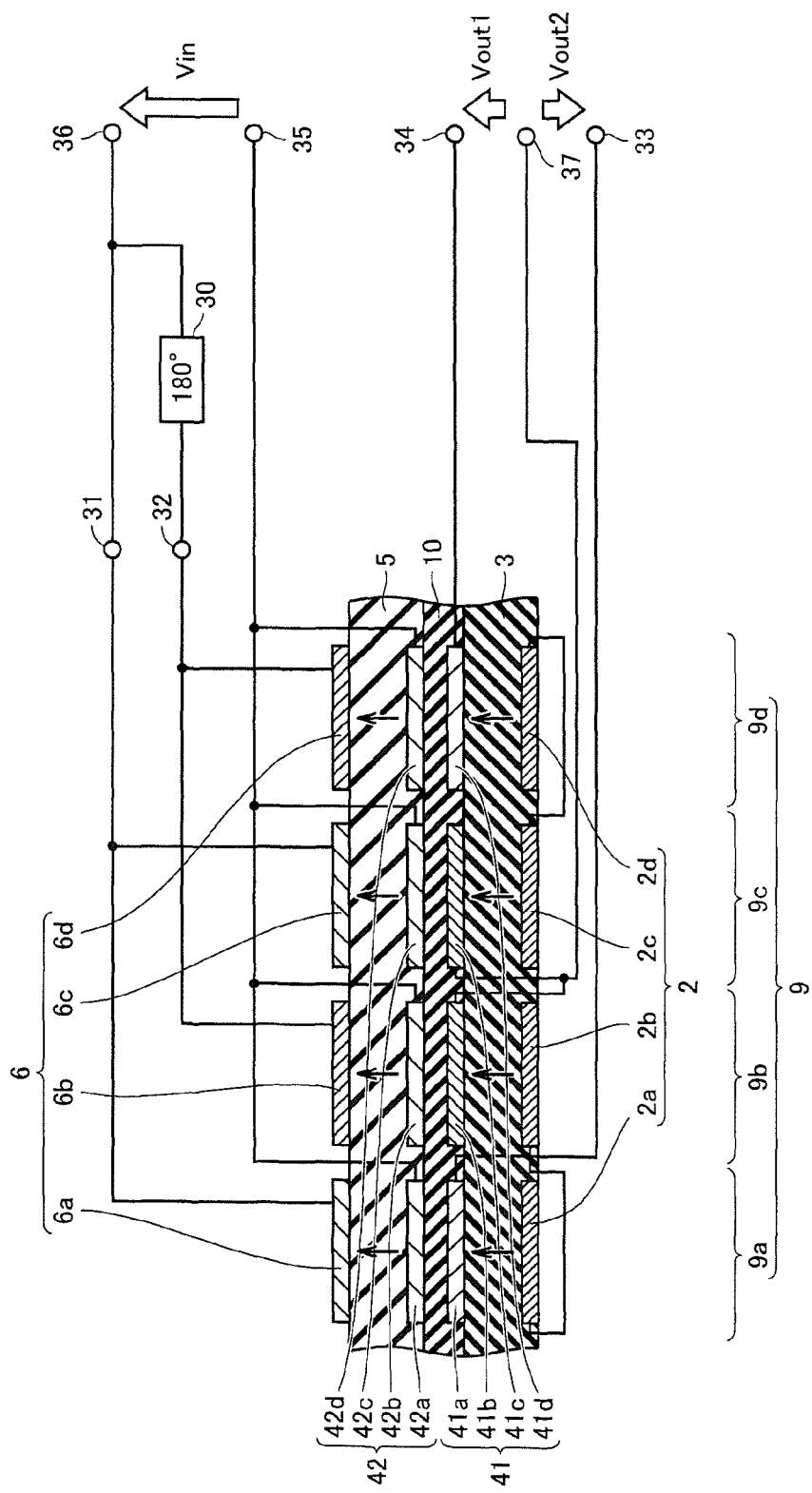
FIG. 30 is a conceptual diagram illustrating the vicinity of a vibration film of a modification of the piezoelectric transformer of embodiment 1 of the present invention.

For example, in FIG. 8, the output-side intermediate electrode piece 41b and the output-side intermediate electrode piece 41c are connected to each other by a wiring line so as to be at the same potential, and these electrode pieces are in a floating state. Instead of the floating state, the configuration illustrated in FIG. 30 may be adopted. In other words, a configuration may be considered in which a wiring line that connects the output-side intermediate electrode piece 41b and the output-side intermediate electrode piece 41c to each other is led out to a pad electrode 37 and two output voltages are extracted with the pad electrode 37 serving as a reference potential. In the example illustrated in FIG. 30, an output voltage Vout1 is extracted from between the pad electrodes 34 and 37 and an output voltage Vout2 is extracted from between the pad electrodes 33 and 37. By adopting this configuration, two output voltages can be obtained.

The device obtained as described above can be used as a piezoelectric transformer that transforms the voltage of an alternating-current power supply and outputs the transformed voltage to an output terminal. According to this embodiment, a high transformation ratio can be realized. This will be described in detail below.

Specifically, the piezoelectric transformer of this embodiment is driven using the principles described below. First, the PZT film constituting the second piezoelectric layer 5 expands and contracts in response to a voltage applied from the alternating-current power supply, and as a result, the vibration portions 9a to 9d are driven as illustrated in FIG. 9.

Figure 9:
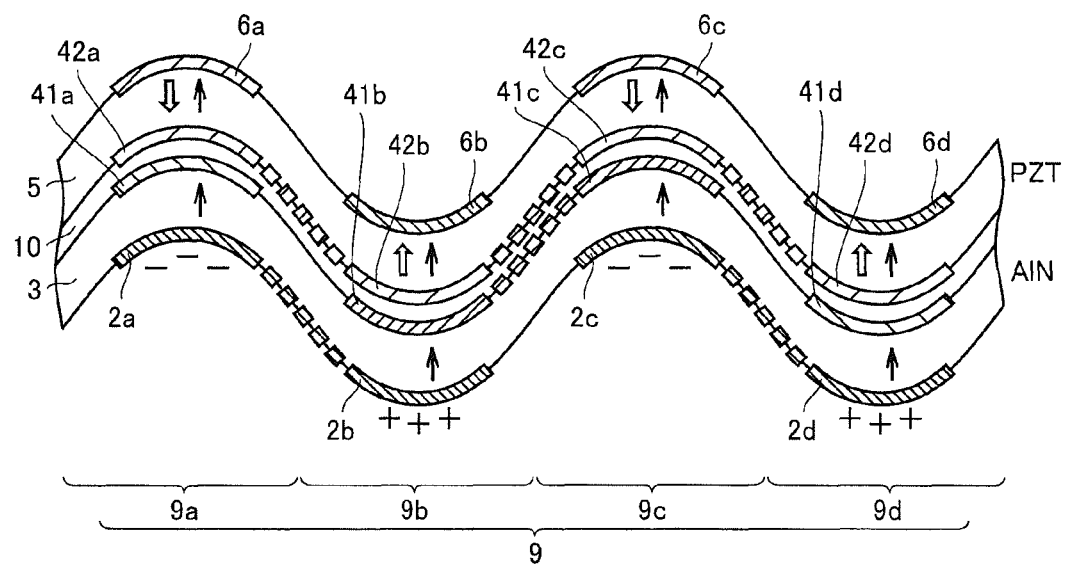
FIG. 9 is an explanatory diagram illustrating the behavior of a vibration portion assembly of the piezoelectric transformer of embodiment 1 of the present invention.

In FIG. 9, the simple arrows illustrated inside the first piezoelectric layer 3 and the second piezoelectric layer 5 indicate the direction of polarization, and the outline arrows illustrated inside the second piezoelectric layer 5 indicate the directions of a generated electric field.

At this time, as illustrated in FIG. 9, the supplied voltages have opposite phases from each other in the regions in which the input electrode pieces 6a and 6c constituting the first input electrode piece group are arranged and in the regions in which the input electrode pieces 6b and 6d constituting the second input electrode piece group are arranged, and therefore the deformations generated in the second piezoelectric layer 5 in these regions have opposite phases from each other. The regions in which the first input electrode piece group is arranged and the regions in which the second input electrode piece group is arranged are arrayed in an alternating manner, and therefore a vibration mode is excited in which the displacement in the regions in which the first input electrode piece group is arranged and the displacement in the regions in which the second input electrode piece group is arranged have opposite phases. Thus, the vibration portions 9a to 9d undergo resonant vibration.

Charge is generated in the AlN film constituting the first piezoelectric layer 3 due to the resonant vibration of the vibration portions 9a to 9d. Since the displacements induced by the second piezoelectric layer 5 have opposite phases from each other, as indicated by "+" and "−" in FIG. 9, the polarities of the charges generated in the regions in which the output electrode pieces 2a and 2c are arranged and in the regions in which the output electrode pieces 2b and 2d are arranged are opposite to each other. The "−" marks illustrated at the output electrode piece 2a indicate that negative charges relatively accumulate at the output electrode piece 2a between the output-side intermediate electrode piece 41a and the output electrode piece 2a. Similarly, the "+" marks illustrated at the output electrode piece 2b indicate that positive charges relatively accumulate at the output electrode piece 2b between the output-side intermediate electrode piece 41b and the output electrode piece 2b. "−" marks are illustrated at the output electrode piece 2a and "+" marks are illustrated at the output electrode piece 2b, i.e., different marks, whereas, the output electrode piece 2a and the output electrode piece 2b are electrically connected to each other and are therefore at the same potential. The output-side intermediate electrode piece 41b and the output-side intermediate electrode piece 41c are electrically connected to each other, and are therefore at the same potential. Since the sets of charges generated by the second piezoelectric layer 5 are relative quantities, the potential difference arising from the chain of sets of charges between the output-side intermediate electrode pieces and the output electrode pieces is large. Thus, a large voltage can be obtained as the output voltage. This principle is the same as in the case where the obtained voltage is increased when a plurality of batteries are connected in series. For example, compared with a potential difference generated between the output-side intermediate electrode piece 41a and the output electrode piece 2a, a potential difference generated between the output-side intermediate electrode piece 41a and the output-side intermediate electrode piece 41d by a chain consisting of the output-side intermediate electrode piece 41a, the output electrode piece 2a, the output electrode piece 2b, the output-side intermediate electrode piece 41b, the output-side intermediate electrode piece 41c, the output electrode piece 2c, the output electrode piece 2d, and the output-side intermediate electrode 41d is around four times as large.

Finally, the generated potential difference is detected as an output voltage between the pad electrodes 33 and 34. At this time, a voltage that is larger than the input voltage Vin can be obtained as the output voltage Vout. In particular, when the first piezoelectric layer 3 is formed of an AlN film and the second piezoelectric layer 5 is formed of a PZT film as in the example described here, the output voltage Vout can be easily made larger than the input voltage Vin, and therefore a voltage boosting operation can be performed with a larger transformation ratio.

In the piezoelectric transformer, it is preferable that the one to n output electrode pieces 2a to 2d include a third output electrode piece and a fourth output electrode piece that are electrically connected to each other, that the third output electrode piece and the second output electrode piece be insulated from each other, that the third output electrode piece and the second output-side intermediate electrode piece be superposed with each other in the thickness direction, and that the fourth output electrode piece be not superposed with the first output-side intermediate electrode piece or the second output-side intermediate electrode piece in the thickness direction.

In the example illustrated in FIG. 8, these conditions are satisfied. In the example illustrated in FIG. 8, the piezoelectric transformer includes the output electrode piece 2c as the third output electrode piece and includes the output electrode piece 2d as the fourth output electrode piece. The output electrode piece 2c and the output electrode piece 2d are electrically connected to each other. The output electrode piece 2d serving as the fourth output electrode piece is not superposed with the output-side intermediate electrode piece 41b serving as the first output-side intermediate electrode piece or the output-side intermediate electrode piece 41c serving as the second output-side intermediate electrode piece in the thickness direction.

When manufacturing a piezoelectric transformer it is preferable to perform a poling treatment by applying a direct-current voltage that is larger than the input voltage Vin between the input electrode pieces 6a and 6c constituting the first input electrode piece group and the input-side intermediate electrode 42 and enables an electric field to be applied to the second piezoelectric layer 5 so as to overcome the coercive electric field of the second piezoelectric layer 5. In this case, it is also preferable to perform a poling treatment by applying a direct-current voltage having the same amplitude and polarity as the previously applied direct-current voltage between the input electrode pieces 6b and 6d constituting the second input electrode piece group and the input-side intermediate electrode 42.

Embodiment 2

Figure 5:
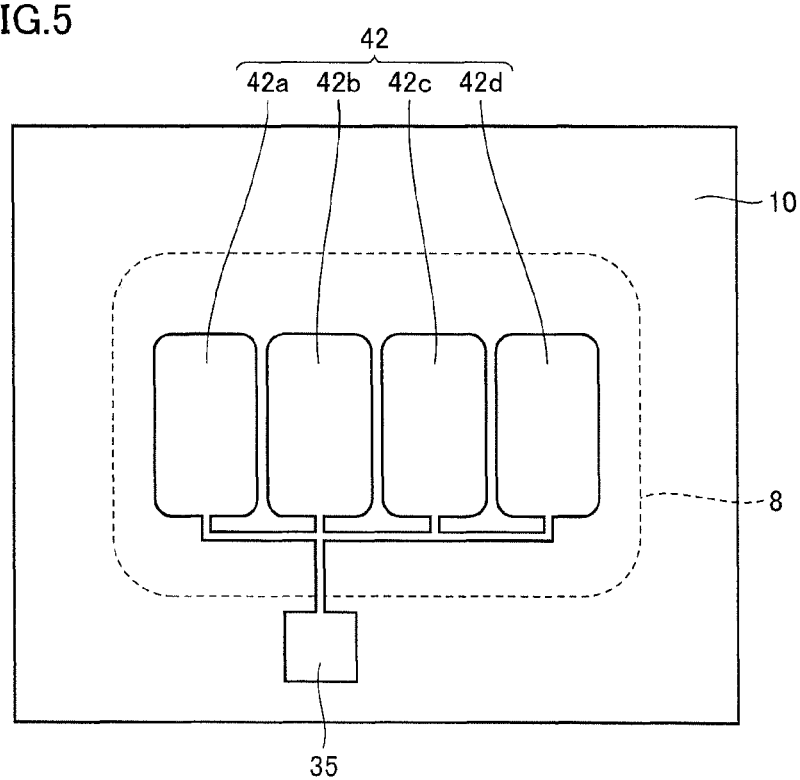
FIG. 5 is a second diagram illustrating the layout of layers included in the piezoelectric transformer of embodiment 1 of the present invention.
Figure 10:
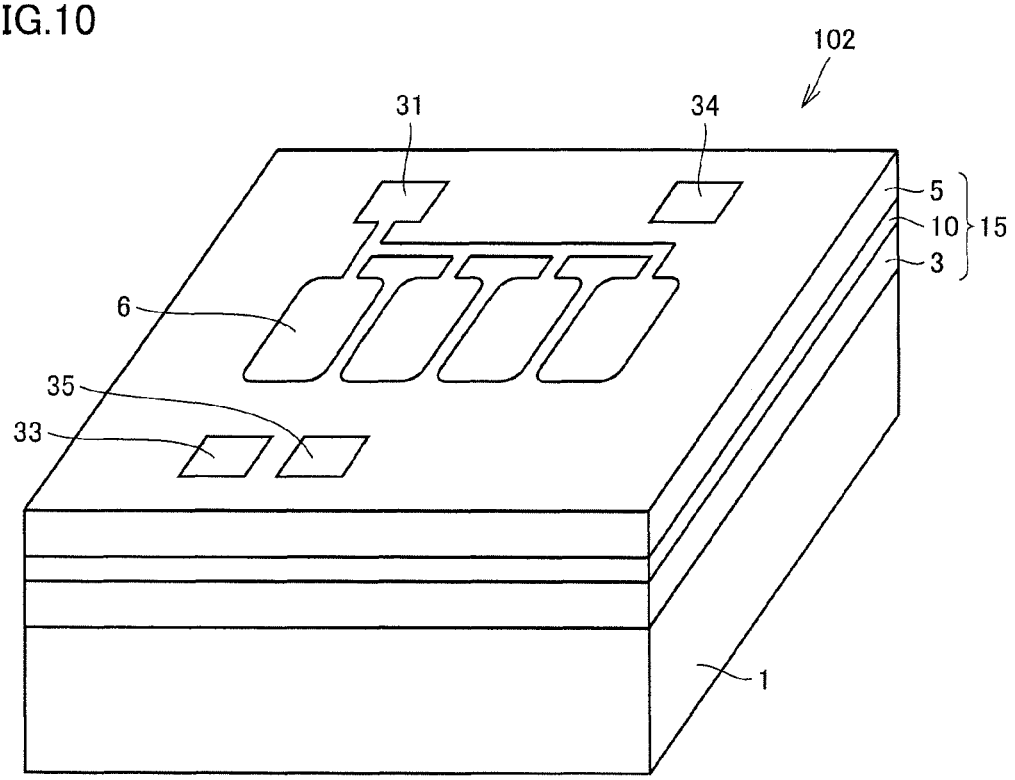
FIG. 10 is a perspective view of a piezoelectric transformer of embodiment 2 of the present invention.
Figure 11:
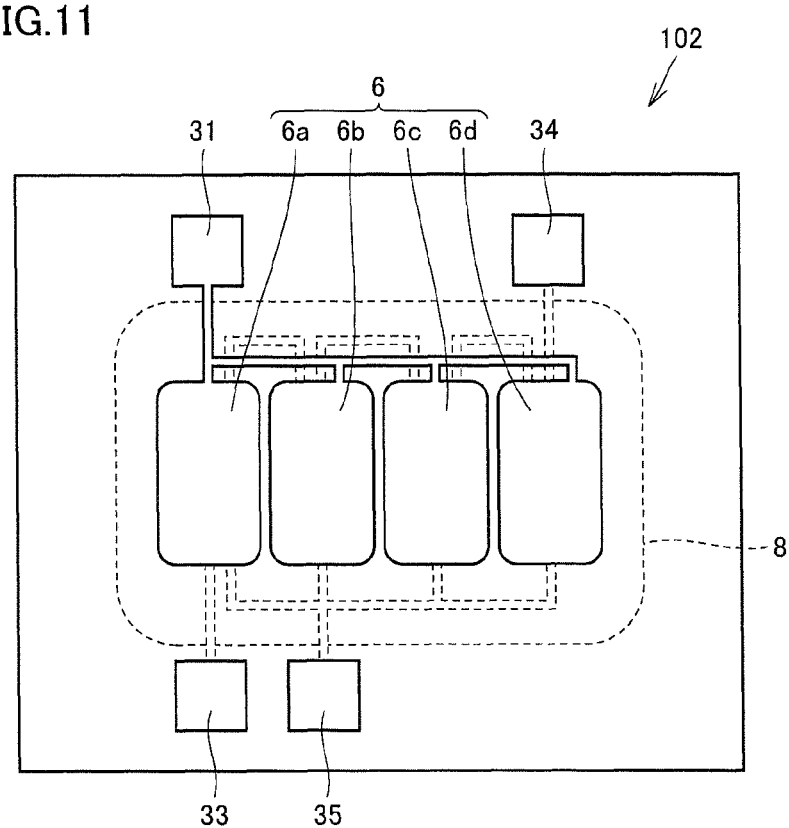
FIG. 11 is a plan view of the piezoelectric transformer of embodiment 2 of the present invention.
Figure 12:
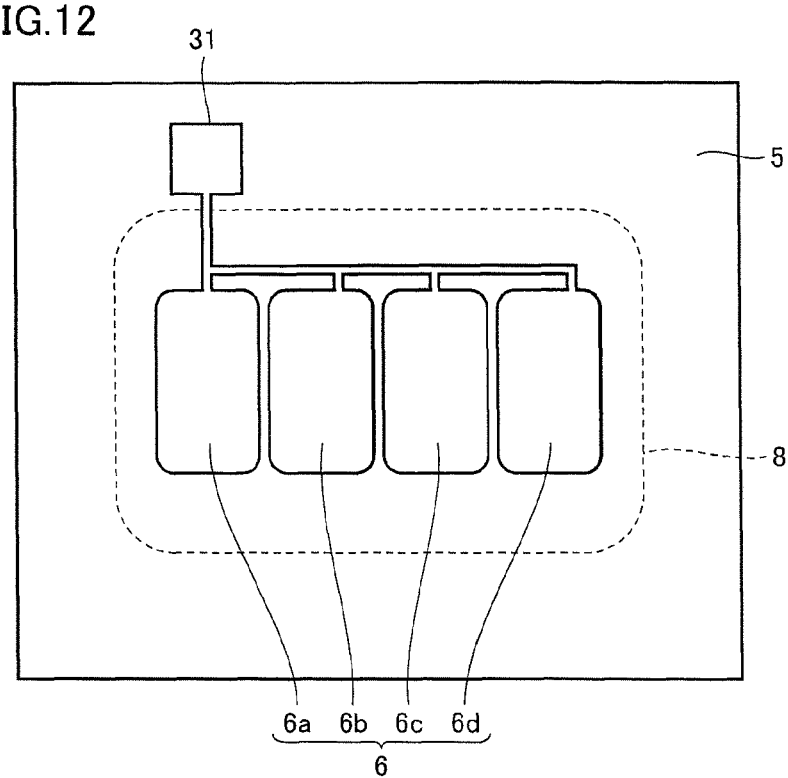
FIG. 12 is a diagram illustrating the layout of one layer included in the piezoelectric transformer of embodiment 2 of the present invention.
Figure 13:
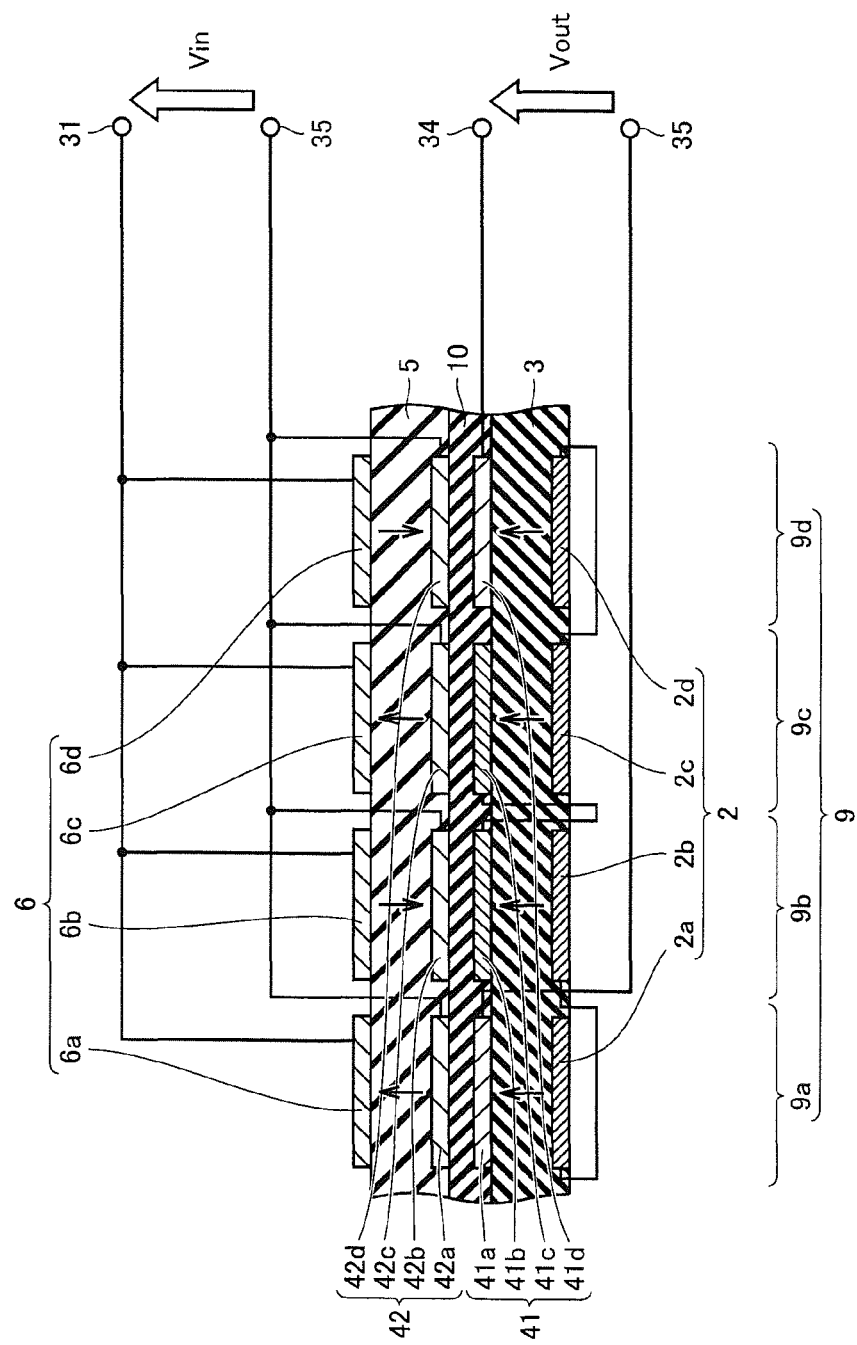
FIG. 13 is a conceptual diagram illustrating the vicinity of a vibration film of the piezoelectric transformer of embodiment 2 of the present invention.

A piezoelectric transformer according to embodiment 2 of the present invention will be described while referring to FIGS. 10 to 13. FIG. 10 illustrates the exterior of a piezoelectric transformer 102 of this embodiment. FIG. 11 illustrates a plan view of the piezoelectric transformer 102. FIG. 12 illustrates the layout of an input electrode 6 and so forth on the upper surface of a second piezoelectric layer 5 included in the piezoelectric transformer 102. The layout of the conductor patterns and so forth of the other layers are the same as illustrated in FIGS. 5 to 7 in embodiment 1. FIG. 13 illustrates a conceptual diagram in which a vibration film of the piezoelectric transformer 102 is illustrated together with related wiring lines.

As illustrated in FIG. 10, the piezoelectric transformer 102 includes a base 1 and an upper layer 15 that is supported by the base 1. The details of the base 1 are the same as described in embodiment 1. The upper layer 15 includes a vibration portion assembly 9, which is formed from the part of the upper layer 15 that is not superposed with the base 1. The vibration portion assembly 9 includes an output electrode 2, an output-side intermediate electrode 41, an input-side intermediate electrode 42, and an input electrode 6 which are arranged so as to be separated from each other in a thickness direction and so as to be arrayed in order in the thickness direction from the base 1. The vibration portion assembly 9 includes n vibration portions 9a to 9d arrayed in one direction, where n is an integer greater than or equal to 3. Here, for convenience of explanation, it will be assumed that n=4 in the following description, but this is merely an example and n may be an integer other than 4. The upper layer 15 includes a first piezoelectric layer 3 that is arranged so that a part thereof is interposed between the output electrode 2 and the output-side intermediate electrode 41 in at least the n vibration portions 9a to 9d; and a second piezoelectric layer 5 that is arranged so as to be superposed with the first piezoelectric layer 3 and so that a part thereof interposed between the input-side intermediate electrode 42 and the input electrode 6 in at least the n vibration portions 9a to 9d. The input electrode 6 includes one to n input electrode pieces 6a to 6d that are arrayed in a divided manner so as to correspond to at least some of the n vibration portions 9a to 9d. The output electrode 2 includes one to n output electrode pieces 2a to 2d that are arrayed in a divided manner so as to correspond to at least some of the n vibration portions 9a to 9d. The output-side intermediate electrode 41 includes one to n output-side intermediate electrode pieces 41a to 41d that are arrayed in a divided manner so as to correspond to at least some of the n vibration portions 9a to 9d.

Referring to the n vibration portions as first to nth vibration portions from one side to the other side along the one direction, as illustrated in FIG. 13, the second piezoelectric layer 5 has one to n polarization regions that correspond to at least some of the n vibration portions 9a to 9d, and the one to n polarization regions are polarized so as to have opposite polarization directions in a first polarization region group, which is a group to which one or more of the polarization regions corresponding to the odd-numbered vibration portions belong, and a second polarization region group, which is a group to which one or more of the polarization regions corresponding to the even-numbered vibration portions belong. Wiring lines are routed such that voltages of the same phase can be applied to the one to n input electrode pieces 6a to 6d with the potential of the input-side intermediate electrode 42 serving as a reference potential. The first piezoelectric layer 3 is polarized in a fixed direction throughout the n vibration portions 9a to 9d. The arrows illustrated inside the first piezoelectric layer 3 and the second piezoelectric layer 5 in FIG. 13 indicate the direction of polarization.

The one to n output electrode pieces 2a to 2d include a first output electrode piece and a second output electrode piece that are electrically connected to each other. The one to n output-side intermediate electrode pieces 41a to 41d include a first output-side intermediate electrode piece and a second output-side intermediate electrode piece that are electrically connected to each other. The second output electrode piece and the first output-side intermediate electrode piece are superposed with each other in the thickness direction. The first output electrode piece is not superposed with the first output-side intermediate electrode piece or the second output-side intermediate electrode piece in the thickness direction. The second output-side intermediate electrode piece is not superposed with the first output electrode piece or the second output electrode piece in the thickness direction.

In this embodiment, as illustrated in FIG. 13, all of the one to n input electrode pieces 6a to 6d are connected to a pad electrode 31, which is an input terminal for an alternating-current power supply, and the potential of the input-side intermediate electrode 42 serves as a reference potential. The pad electrode 35 is connected to the input-side intermediate electrode 42 by wiring lines.

In this embodiment as well, an output voltage Vout can be extracted from between the pad electrodes 33 and 34 similarly to as in embodiment 1.

The input-side configuration in this embodiment is different from that in embodiment 1, but the output-side configuration is the same as in embodiment 1. In this embodiment as well, the device can be used as a piezoelectric transformer. According to this embodiment, a high transformation ratio can be realized similarly to as in embodiment 1. In this embodiment, the second piezoelectric layer 5, which is on the input side, can be driven using a voltage of a single phase, and therefore the input-side wiring and circuit can be simplified.

Figure 14:
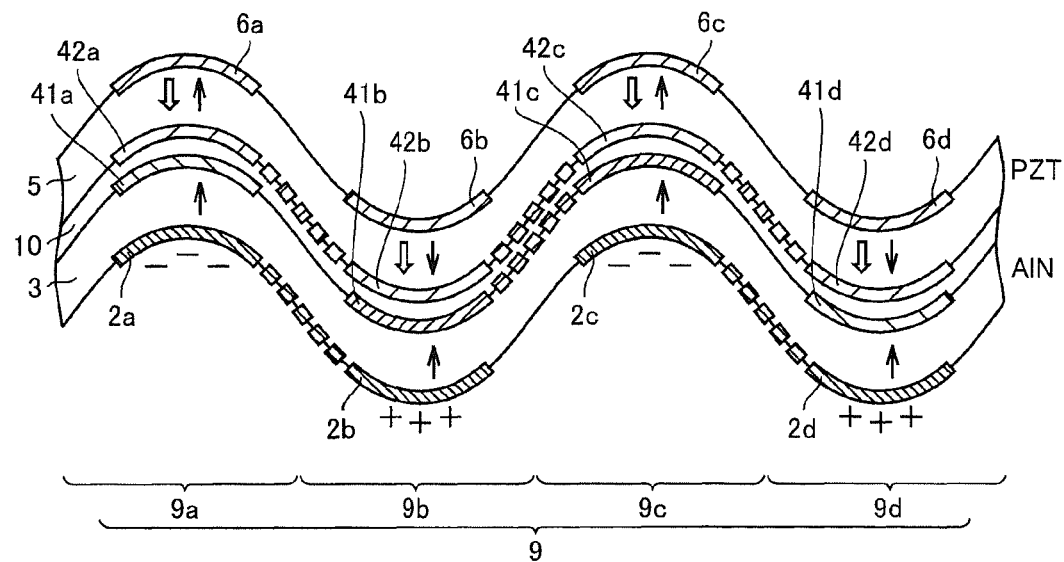
FIG. 14 is an explanatory diagram illustrating the behavior of a vibration portion assembly of the piezoelectric transformer of embodiment 2 of the present invention.

The behavior in this embodiment when an input voltage Vin is applied is illustrated in FIG. 14. The meanings of the arrows are the same as those described with respect to FIG.

9. In FIG. 14, the voltages applied to the one to n polarization regions of the second piezoelectric layer 5 all have the same phase, and therefore the outline arrows indicating the electric field all point in the same direction. In this embodiment, the one to n polarization regions of the second piezoelectric layer 5 are polarized such that adjacent polarization regions have opposite polarization directions from each other as indicated by the simple arrows in FIG. 14, and therefore for example, deformation is induced in opposite directions even though the directions of the electric field in these regions are the same. Thus, the vibration portions 9a to 9d undergo resonant vibration.

Charge is generated in the first piezoelectric layer 3 on the output side by this resonant vibration. The way in which this charge is extracted as an output voltage is the same as described in embodiment 1.

Embodiment 3

Figure 15:
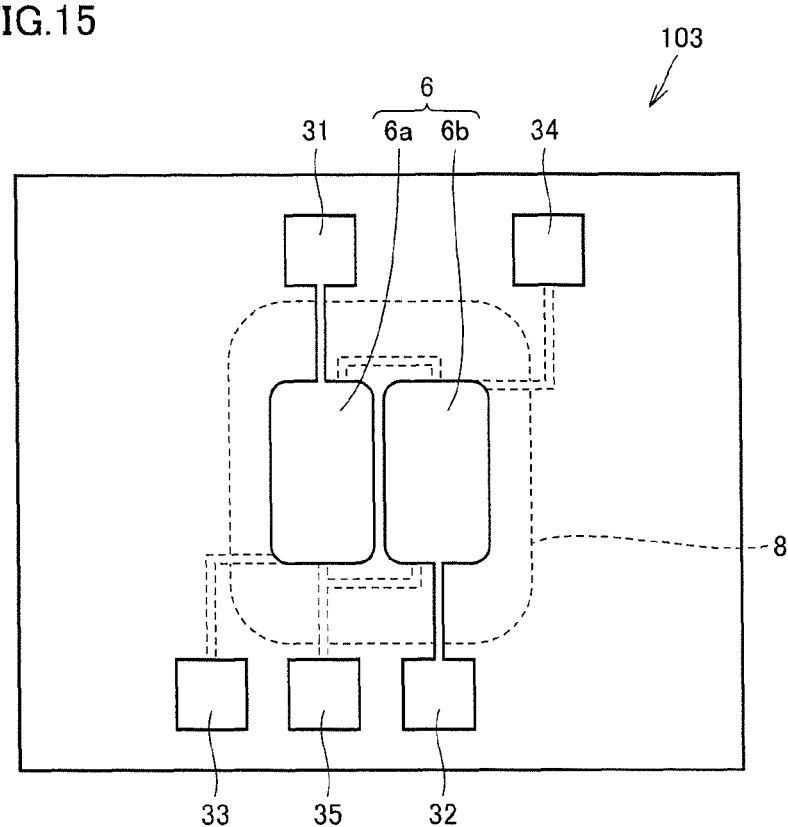
FIG. 15 is a plan view of a piezoelectric transformer of embodiment 3 of the present invention.
Figure 16:
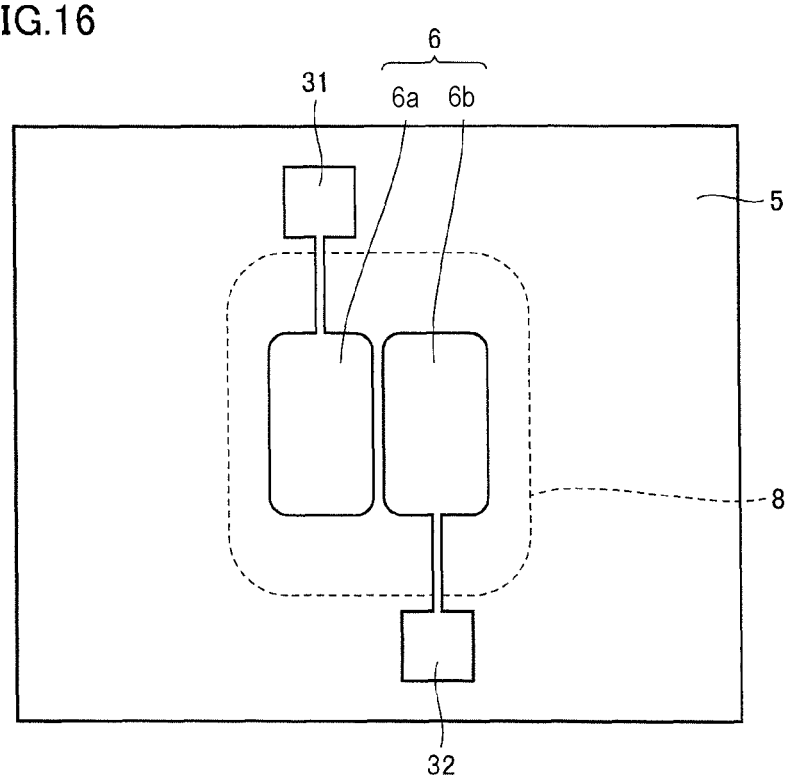
FIG. 16 is a first diagram illustrating the layout of layers included in the piezoelectric transformer of embodiment 3 of the present invention.
Figure 17:
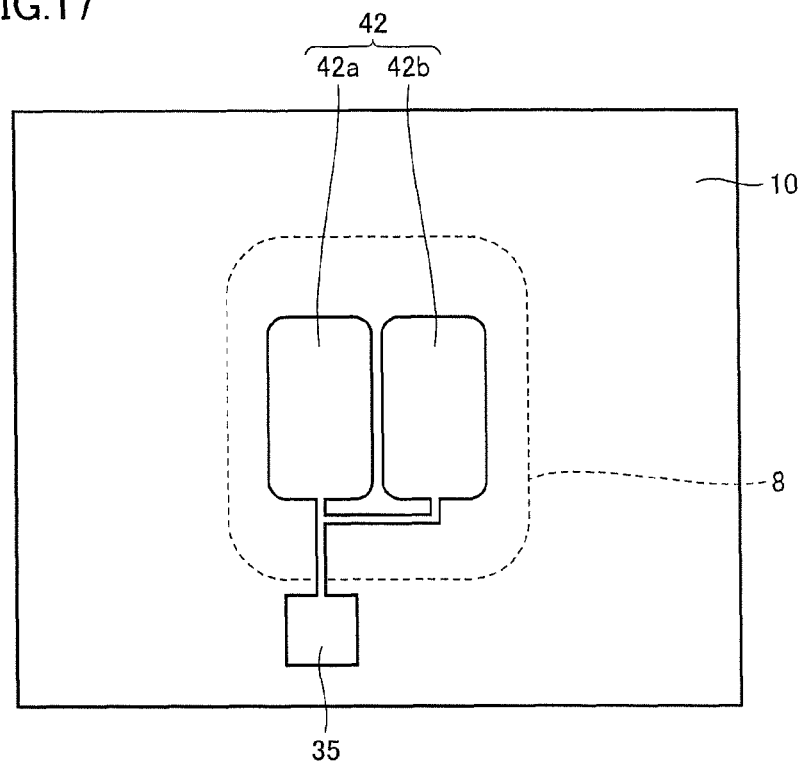
FIG. 17 is a second diagram illustrating the layout of layers included in the piezoelectric transformer of embodiment 3 of the present invention.
Figure 18:
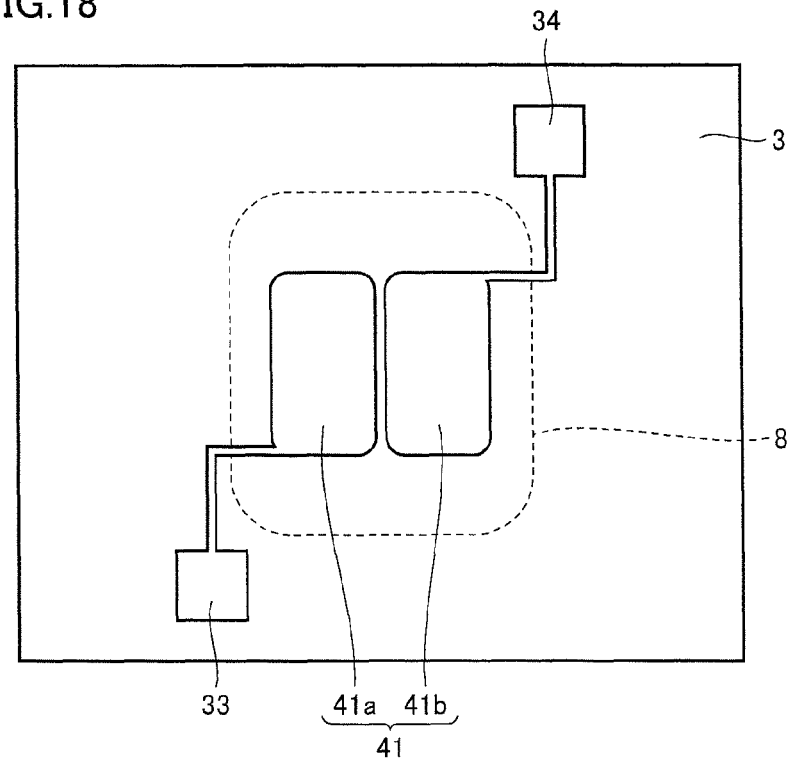
FIG. 18 is a third diagram illustrating the layout of layers included in the piezoelectric transformer of embodiment 3 of the present invention.
Figure 19:
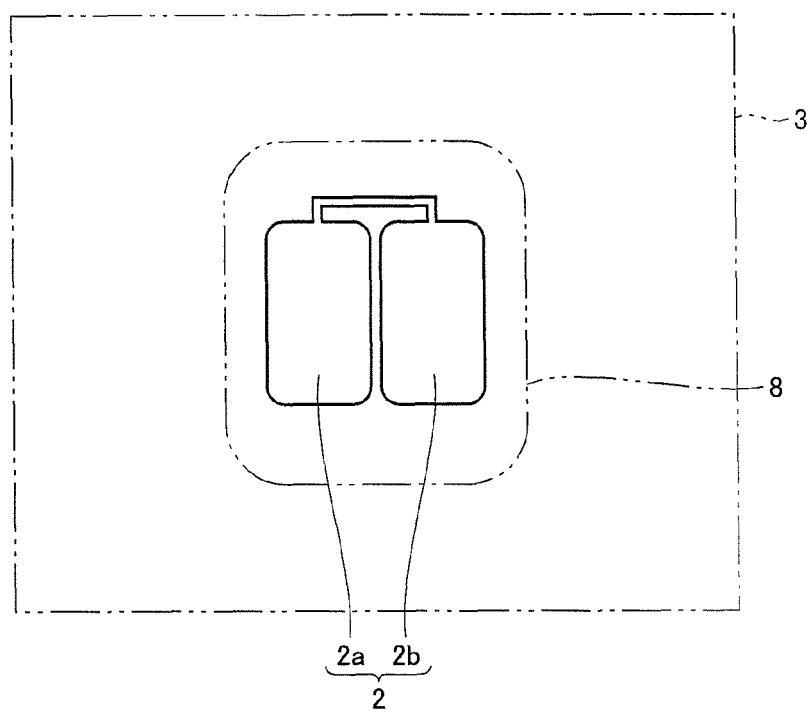
FIG. 19 is a fourth diagram illustrating the layout of layers included in the piezoelectric transformer of embodiment 3 of the present invention.
Figure 20:
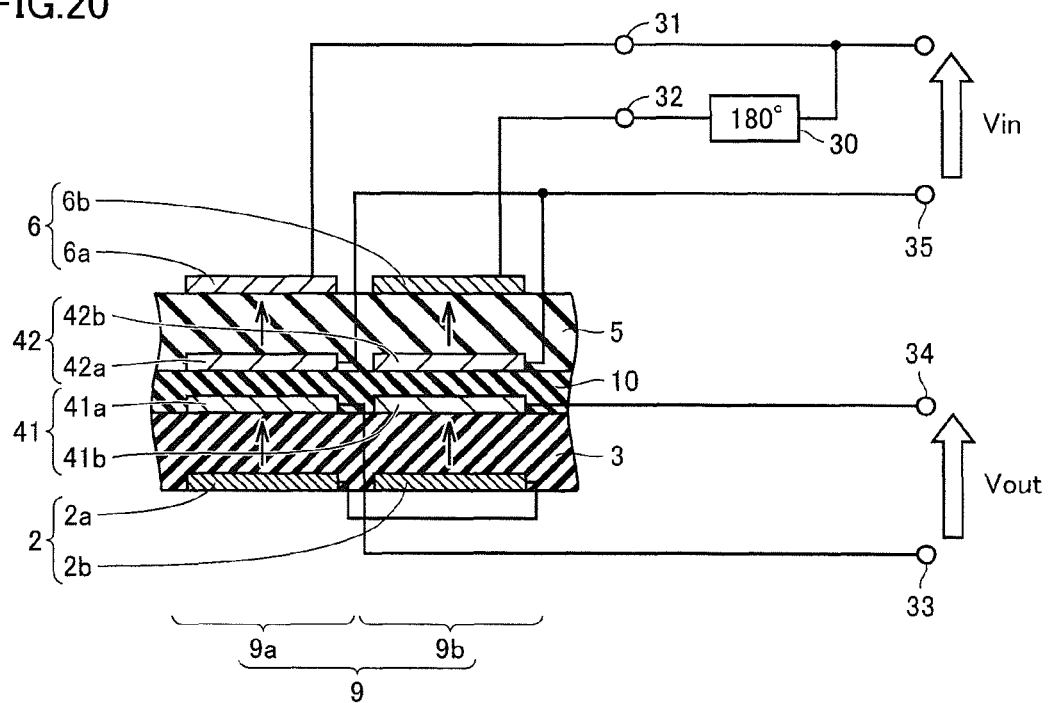
FIG. 20 is an explanatory diagram illustrating the behavior of a vibration portion assembly of the piezoelectric transformer of embodiment 3 of the present invention.

A piezoelectric transformer according to embodiment 3 of the present invention will be described while referring to FIGS. 15 to 20. FIG. 15 illustrates a plan view of a piezoelectric transformer 103 according to this embodiment. FIGS. 16 to 19 illustrate the layouts of conductor patterns and so forth of layers included in the piezoelectric transformer 103. FIG. 20 illustrates a conceptual diagram in which a vibration film of the piezoelectric transformer 103 is illustrated together with related wiring lines.

The piezoelectric transformer 103 corresponds to a case in which n=2 in the piezoelectric transformer 101 described in embodiment 1. In other words, as illustrated in FIG. 20, the vibration portion assembly 9 includes two vibration portions 9a and 9b. The input electrode 6 includes one to n input electrode pieces 6a and 6b that are arrayed in a divided manner so as to correspond to at least some of the n, i.e., two vibration portions 9a and 9b. The output electrode 2 includes one to n output electrode pieces 2a and 2b that are arrayed in a divided manner so as to correspond to at least some of the n, i.e., two vibration portions 9a and 9b. The output-side intermediate electrode 41 includes one to n output-side intermediate electrode pieces 41a and 41b that are arrayed in a divided manner so as to respectively correspond to at least some of the n, i.e., two vibration portions 9a and 9b. The input-side intermediate electrode 42 includes one to n input-side intermediate electrode pieces 42a and 42b that are arrayed in a divided manner so as to respectively correspond to at least some of the n, i.e., two vibration portions 9a and 9b.

In this embodiment, since n=2, only the input electrode piece 6a belongs to the first input electrode piece group and only the input electrode piece 6b belongs to the second input electrode piece group. Wiring lines are routed such that voltages of opposite phases can be respectively applied to the first input electrode piece group and the second input electrode piece group with the potential of the input-side intermediate electrode 42 serving as a reference potential.

The output electrode piece 2a and the output electrode piece 2b are electrically connected to each other. The output-side intermediate electrode piece 41a is superposed with the output electrode piece 2a in the thickness direction. The output-side intermediate electrode piece 41b is superposed with the output electrode piece 2b in the thickness direction. The output-side intermediate electrode piece 41a is connected to the pad electrode 33. The output-side intermediate electrode piece 41b is connected to the pad electrode 34.

The piezoelectric transformer of this embodiment can be implemented as follows. The piezoelectric transformer of this embodiment includes a base 1 and an upper layer 15 that is supported by the base 1. The upper layer 15 includes a vibration portion assembly 9, which is constituted by the part of the upper layer 15 that is not superposed with the base 1. The vibration portion assembly 9 includes the output electrode 2, the output-side intermediate electrode 41, the input-side intermediate electrode 42, and the input electrode 6 which are arranged so as to be separated from each other in a thickness direction and so as to be sequentially arrayed in the thickness direction. The vibration portion assembly 9 includes the vibration portions 9a and 9b that are arrayed in one direction. The upper layer 15 includes a first piezoelectric layer 3 that is arranged so as to include a part thereof interposed between the output electrode 2 and the output-side intermediate electrode 41 in at least the first and second vibration portions 9a and 9b and a second piezoelectric layer 5 that is arranged so as to be superposed with the first piezoelectric layer 3 and includes a part thereof interposed between the input-side intermediate electrode 42 and the input electrode 6 in the first and second vibration portions 9a and 9b. The input electrode 6 includes the first and second input electrode pieces 6a and 6b that are arrayed so as to correspond to the first and second vibration portions 9a and 9b. The output electrode 2 includes the first and second output electrode pieces 2a and 2b that are arrayed so as to correspond to the first and second vibration portions 9a and 9b. The second piezoelectric layer 5 is polarized in a fixed direction across the first and second vibration portions 9a and 9b. Wiring lines are routed such that voltages of opposite phases can be respectively applied to the first input electrode piece 6a and the second input electrode piece 6b with the potential of the input-side intermediate electrode 42 serving as a reference potential. The first piezoelectric layer 3 is polarized in a fixed direction across the first and second vibration portions 9a and 9b. The output-side intermediate electrode 41 includes the first output-side intermediate electrode piece 41a and the second output-side intermediate electrode piece 41b. The first output electrode piece 2a and the first output-side intermediate electrode piece 41a are superposed with each other in the thickness direction. The second output electrode piece 2b and the second output-side intermediate electrode piece 41b are superposed with each other in the thickness direction.

In this embodiment, a PZT film that constitutes the second piezoelectric layer 5 expands and contracts in response to a voltage applied by an alternating-current power supply, and as a result the vibration portions 9a and 9b are driven. At this time, as illustrated in FIG. 20, the supplied voltages have opposite phases from each other in the region in which the input electrode piece 6a constituting the first input electrode piece group is arranged and in the region in which the input electrode piece 6b constituting the second input electrode piece group is arranged, and therefore the deformations generated in the second piezoelectric layer 5 in these regions have opposite phases from each other. A vibration mode is excited in which the displacement in the region in which the first input electrode piece group is arranged and the displacement in the region in which the second input electrode piece group is arranged have opposite phases from each other. Thus, the vibration portions 9a and 9b undergo resonant vibration.

Charge is generated in the AlN film constituting the first piezoelectric layer 3 due to the resonant vibration of the vibration portions 9a and 9b. The output electrode piece 2a and the output electrode piece 2b are electrically connected to each other, and as a result a potential difference between the output-side intermediate electrode piece 41a and the output-side intermediate electrode piece 41b is around twice the potential difference between the output-side intermediate electrode piece 41a and the output electrode piece 2a. A potential difference is extracted from between the output-side intermediate electrode piece 41a and the output-side intermediate electrode piece 41b at the pad electrodes 33 and 34, and therefore a large voltage can be obtained as the output voltage Vout.

In particular, when the first piezoelectric layer 3 is formed of an AlN film and the second piezoelectric layer 5 is formed of a PZT film as in the example described here, the output voltage Vout can be easily made larger than the input voltage Vin, and therefore a voltage boosting operation can be performed with a larger transformation ratio.

Here, the output electrode 2 includes the first and second output electrode pieces 2a and 2b arrayed so as to correspond to the first and second vibration portions 9a and 9b, but the output electrode 2 may instead be an integrated electrode that is not divided into two electrode pieces in this way and extends so as to cover the first and second vibration portions 9a and 9b. This also applies to a modification described below.

Figure 31:
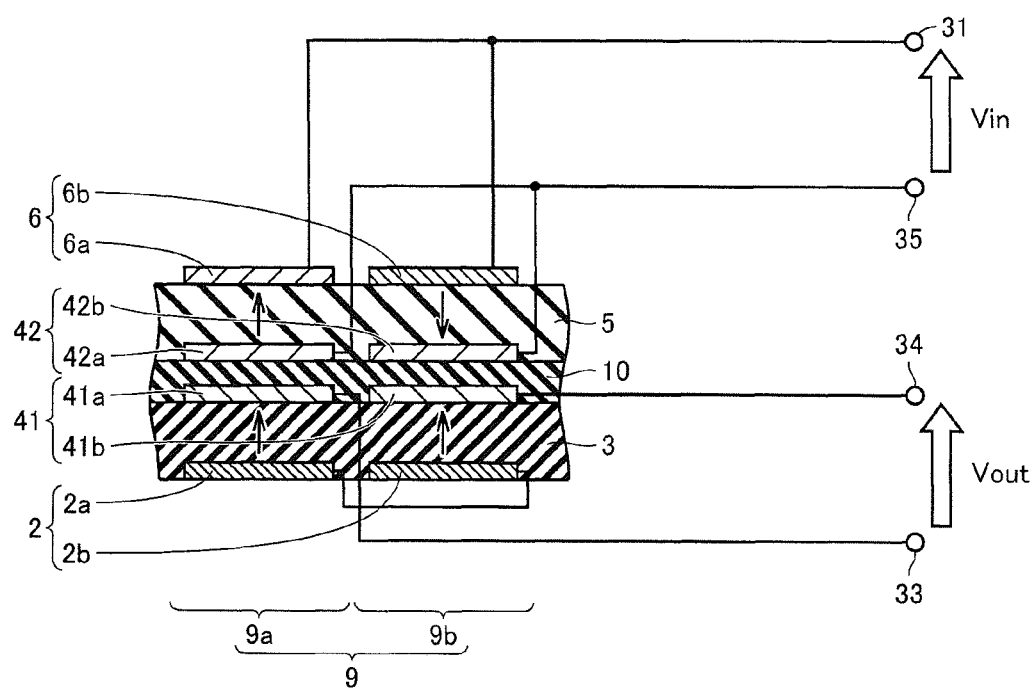
FIG. 31 is a conceptual diagram illustrating the vicinity of a vibration film of a modification of the piezoelectric transformer of embodiment 3 of the present invention.

The following modification of the piezoelectric transformer of this embodiment can also be considered. As seen from the main part of a piezoelectric transformer illustrated in FIG. 31, the piezoelectric transformer includes a base 1 and an upper layer 15 that is supported by the base 1. The upper layer 15 includes a vibration portion assembly 9, which is constituted by the part of the upper layer 15 that is not superposed with the base 1. The vibration portion assembly 9 includes an output electrode 2, an output-side intermediate electrode 41, an input-side intermediate electrode 42, and an input electrode 6, which are arranged so as to be separated from each other in a thickness direction and so as to be sequentially arrayed in the thickness direction. The vibration portion assembly 9 includes first and second vibration portions 9a and 9b arrayed in one direction. The upper layer 15 includes a first piezoelectric layer 3 that is arranged so as to include a part thereof interposed between the output electrode 2 and the output-side intermediate electrode 41 in the first and second vibration portions 9a and 9b and a second piezoelectric layer 5 that is arranged so as to be superposed with the first piezoelectric layer 3 and is arranged so as to include a part thereof interposed between the input-side intermediate electrode 42 and the input electrode 6 in the first and second vibration portions 9a and 9b. The input electrode 6 includes the first and second input electrode pieces 6a and 6b that are arrayed so as to correspond to the first and second vibration portions 9a and 9b. The output electrode 2 includes the first and second output electrode pieces 2a and 2b that are arrayed so as to correspond to the first and second vibration portions 9a and 9b. The second piezoelectric layer 5 is polarized so as to have opposite polarization directions in the first vibration portion 9a and the second vibration portion 9b. Wiring lines are routed such that voltages of the same phase can be applied to the first input electrode piece 6a and the second input electrode piece 6b with the potential of the input-side intermediate electrode 42 serving as a reference potential. The first piezoelectric layer 3 is polarized in a fixed direction across the first and second vibration portions 9a and 9b. The output-side intermediate electrode 41 includes the first output-side intermediate electrode piece 41a and the second output-side intermediate electrode piece 41b. The first output electrode piece 2a and the first output-side intermediate electrode piece 41a are superposed with each other in the thickness direction. The second output electrode piece 2b and the second output-side intermediate electrode piece 41b are superposed with each other in the thickness direction.

Embodiment 4

Figure 21:
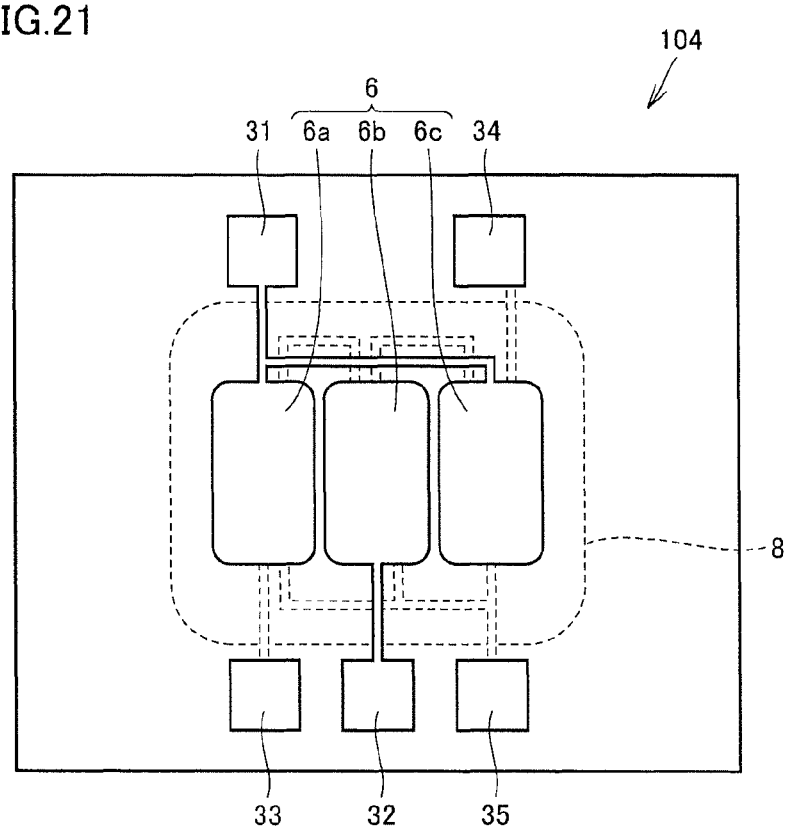
FIG. 21 is a plan view of a piezoelectric transformer of embodiment 4 of the present invention.
Figure 22:
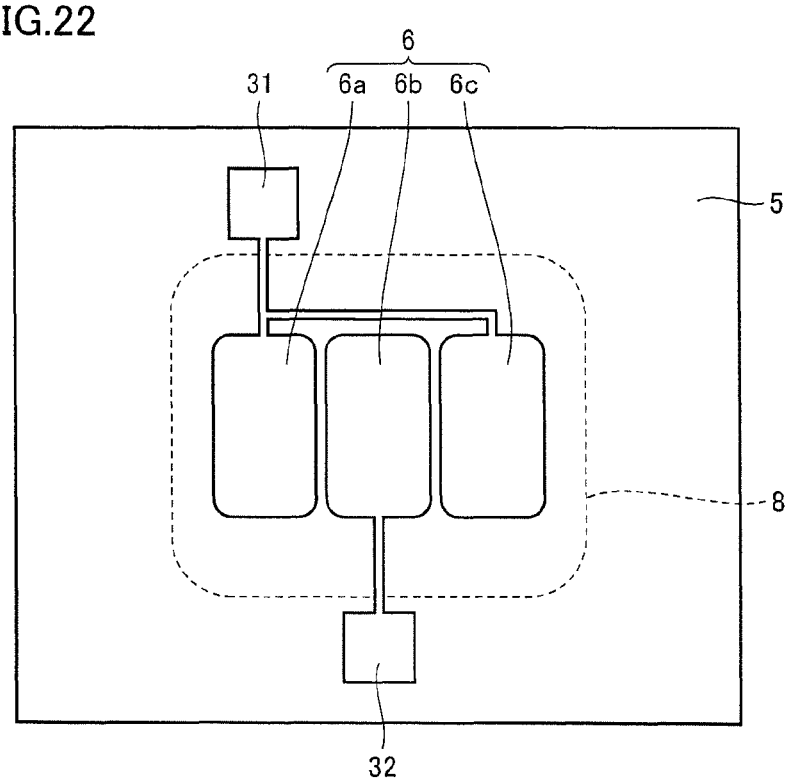
FIG. 22 is a first diagram illustrating the layout of layers included in the piezoelectric transformer of embodiment 4 of the present invention.
Figure 23:
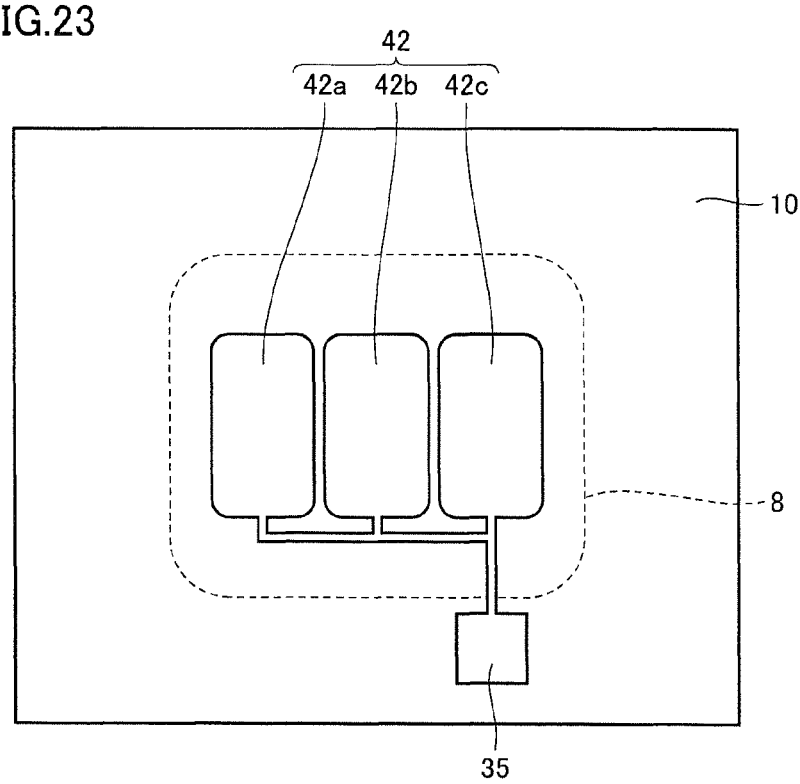
FIG. 23 is a second diagram illustrating the layout of layers included in the piezoelectric transformer of embodiment 4 of the present invention.
Figure 24:
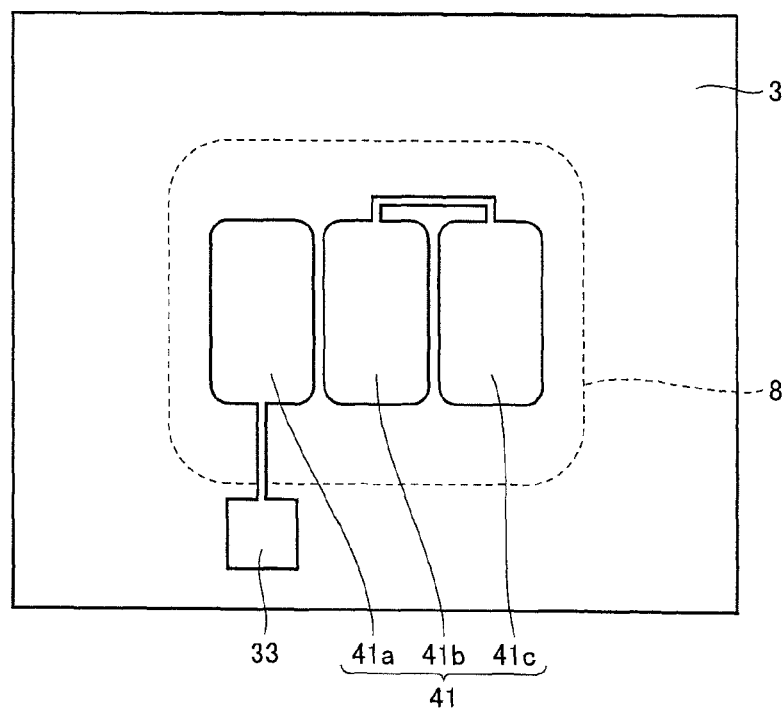
FIG. 24 is a third diagram illustrating the layout of layers included in the piezoelectric transformer of embodiment 4 of the present invention.
Figure 25:
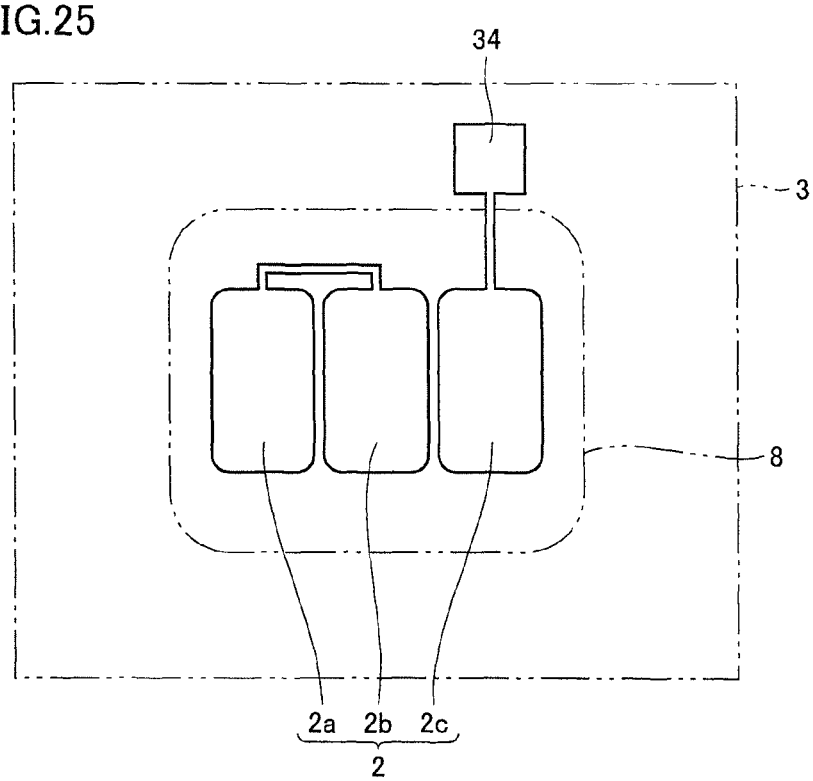
FIG. 25 is a fourth diagram illustrating the layout of layers included in the piezoelectric transformer of embodiment 4 of the present invention.
Figure 26:
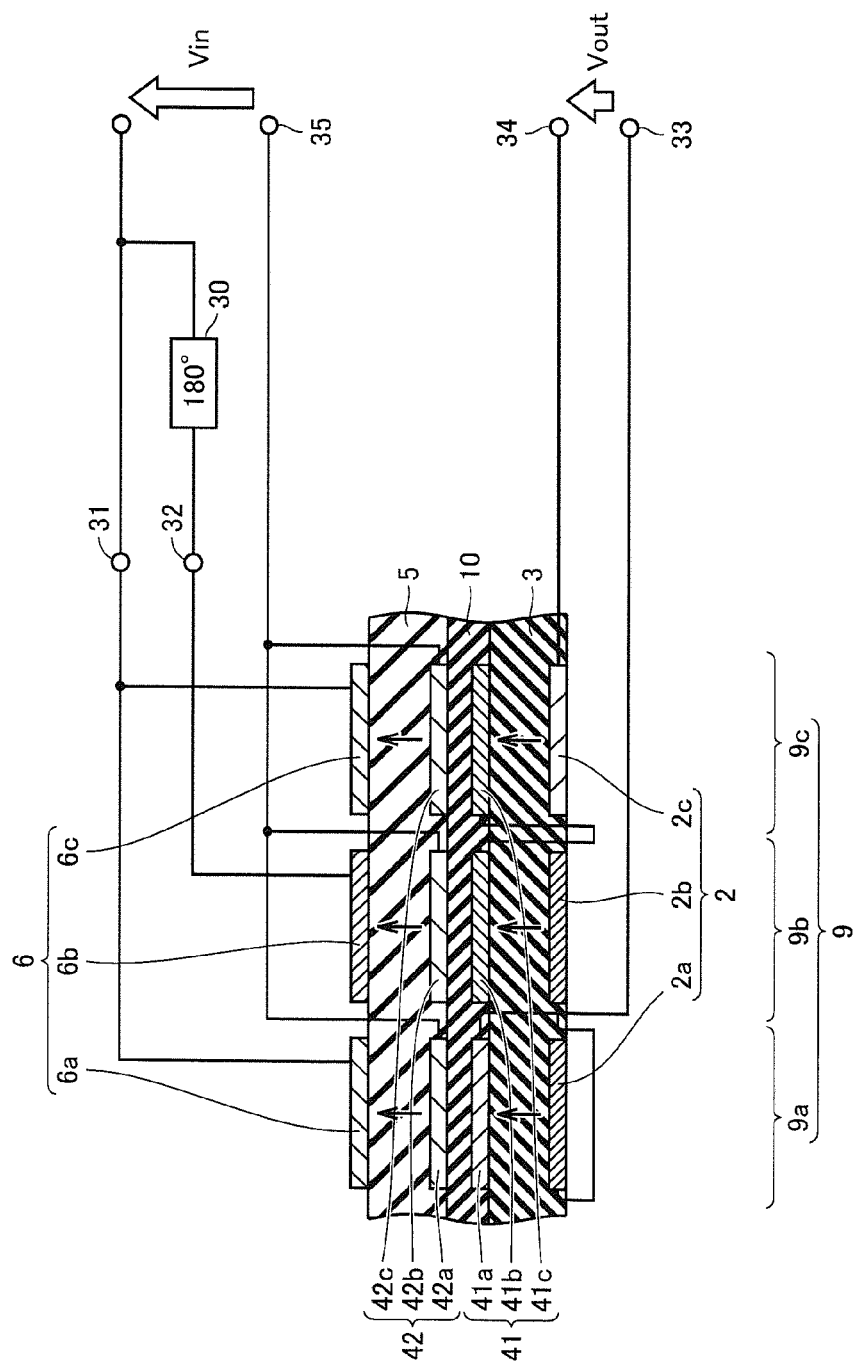
FIG. 26 is a conceptual diagram illustrating the vicinity of a vibration film of the piezoelectric transformer of embodiment 4 of the present invention.

A piezoelectric transformer according to embodiment 4 of the present invention will be described while referring to FIGS. 21 to 26. FIG. 21 illustrates a plan view of a piezoelectric transformer 104 according to this embodiment. FIGS. 22 to 25 illustrate the layouts of conductor patterns and so forth of layers included in the piezoelectric transformer 104. FIG. 26 illustrates a conceptual diagram in which a vibration film of the piezoelectric transformer 104 is illustrated together with related wiring lines.

The piezoelectric transformer 104 corresponds to a case in which n=3 in the piezoelectric transformer 101 described in embodiment 1. In other words, as illustrated in FIG. 26, the vibration portion assembly 9 includes three vibration portions 9a to 9c.

The input electrode 6 includes one to n input electrode pieces 6a to 6c that are arrayed in a divided manner so as to correspond to at least some of the n, i.e., three vibration portions 9a to 9c. The output electrode 2 includes one to n output electrode pieces 2a to 2c that are arrayed in a divided manner so as to correspond to at least some of the n, i.e., three vibration portions 9a to 9c. The output-side intermediate electrode 41 includes one to n output-side intermediate electrode pieces 41a to 41c that are arrayed in a divided manner so as to correspond to at least some of the n, i.e., three vibration portions 9a to 9c. The input-side intermediate electrode 42 includes one to n input-side intermediate electrode pieces 42a to 42c that are arrayed in a divided manner so as to respectively correspond to at least some of the n, i.e., three vibration portions 9a to 9c.

In this embodiment, since n=3, only the input electrode pieces 6a and 6c belong to the first input electrode piece group and only the input electrode piece 6b belongs to the second input electrode piece group. Wiring lines are routed such that voltages of opposite phases can be respectively applied to the first input electrode piece group and the second input electrode piece group with the potential of the input-side intermediate electrode 42 serving as a reference potential.

The output electrode piece 2a and the output electrode piece 2b are electrically connected to each other. The output-side intermediate electrode piece 41a is superposed with the output electrode piece 2a in the thickness direction. The output-side intermediate electrode piece 41b is superposed with the output electrode piece 2b in the thickness direction. The output-side intermediate electrode piece 41b and the output-side intermediate electrode piece 41c are electrically connected to each other. The output-side intermediate electrode piece 41a is connected to the pad electrode 33. The output-side intermediate electrode piece 41b is connected to the pad electrode 34.

In this embodiment as well, the vibration portions 9a to 9c undergo resonant vibration similarly to as in embodiment 3.

Charge is generated in the AlN film constituting the first piezoelectric layer 3 due to the resonant vibration of the vibration portions 9a to 9c. The output electrode piece 2a and the output electrode piece 2b are at the same potential and the output-side intermediate electrode piece 41b and the output-side intermediate electrode piece 41c are at the same potential, and therefore the potential difference between the output-side intermediate electrode piece 41a and the output-side intermediate electrode piece 41b is around three times the potential difference between the output-side intermediate electrode piece 41a and the output electrode piece 2a. A potential difference is extracted from between the output-side intermediate electrode piece 41a and the output-side intermediate electrode piece 41b at the pad electrodes 33 and 34, and therefore a large voltage can be obtained as the output voltage Vout.

Figure 27:
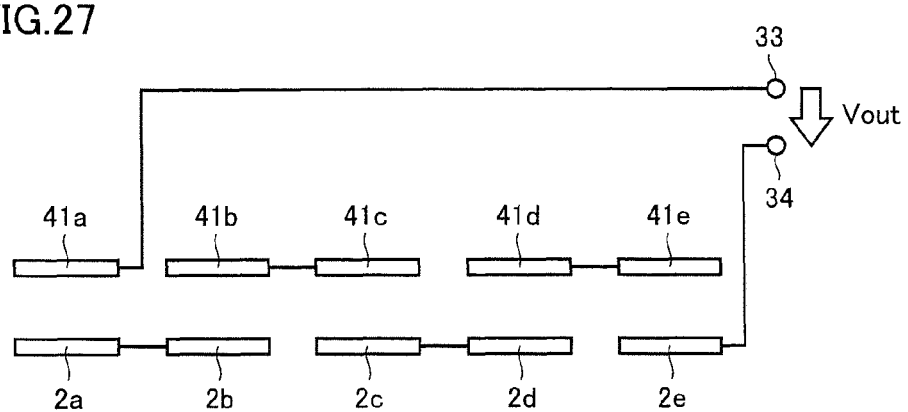
FIG. 27 is a diagram schematically illustrating the output-side structure of a piezoelectric transformer when n=5.

Further description will be given regarding the output-side structure of a piezoelectric transformer. As described in a number of embodiments above, a piezoelectric transformer includes one to n output-side intermediate electrode pieces and one to n output electrode pieces when n represents the number of vibration portions. Here, as an example, it is assumed that a piezoelectric transformer includes n output-side intermediate electrode pieces and n output electrode pieces, which is the same number as the number n of vibration portions. In FIG. 27, the n output-side intermediate electrode pieces and the n output electrode pieces of the piezoelectric transformer are extracted and the electrical connections and superposition relationships therebetween are schematically illustrated. In FIG. 27, a case in which n=5 is illustrated. In FIG. 27, output electrode pieces 2a to 2e and output-side intermediate electrode pieces 41a to 41e are arrayed.

Figure 28:
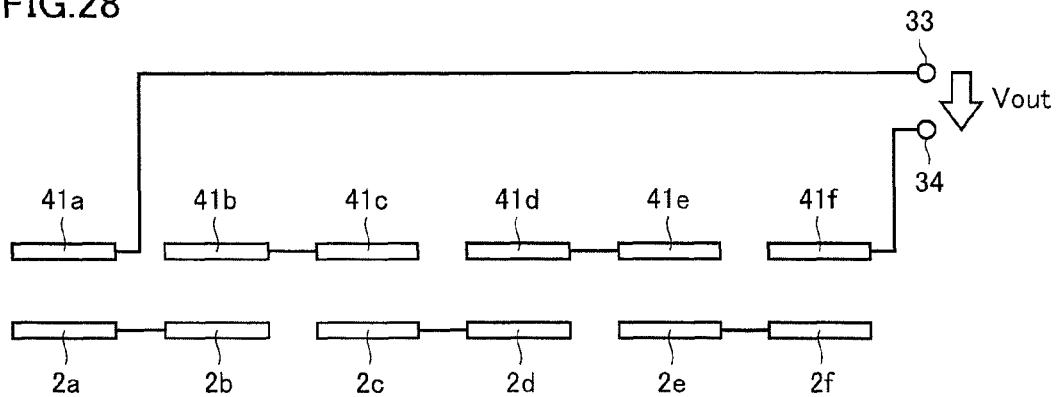
FIG. 28 is a diagram schematically illustrating the output-side structure of a piezoelectric transformer when n=6.

A case in which n=6 is illustrated in FIG. 28. In FIG. 28, output electrode pieces 2a to 2f and output-side intermediate electrode pieces 41a to 41f are arrayed.

In the case where n is greater than or equal to 6, it is preferable that the following conditions be satisfied. In the piezoelectric transformer, the one to n output electrode pieces include a fifth output electrode piece and a sixth output electrode piece that are electrically connected to each other. The fifth output electrode piece and the second output electrode piece are insulated from each other, and the fifth output electrode piece and the fourth output electrode piece are insulated from each other. The one to n output-side intermediate electrode pieces include a third output-side intermediate electrode piece and a fourth output-side intermediate electrode piece that are electrically connected to each other. The third output-side intermediate electrode piece and the second output-side intermediate electrode piece are insulated from each other. The fourth output electrode piece and the third output-side intermediate electrode piece are superposed with each other in the thickness direction. The fifth output electrode piece and the fourth output-side intermediate electrode piece are superposed with each other in the thickness direction. The sixth output electrode piece is not superposed with any of the first to fourth output-side intermediate electrode pieces in the thickness direction. In the example illustrated in FIG. 28, the piezoelectric transformer includes an output electrode piece 2d that serves as the fifth output electrode piece and a sixth output electrode piece 2e.

Figure 29:
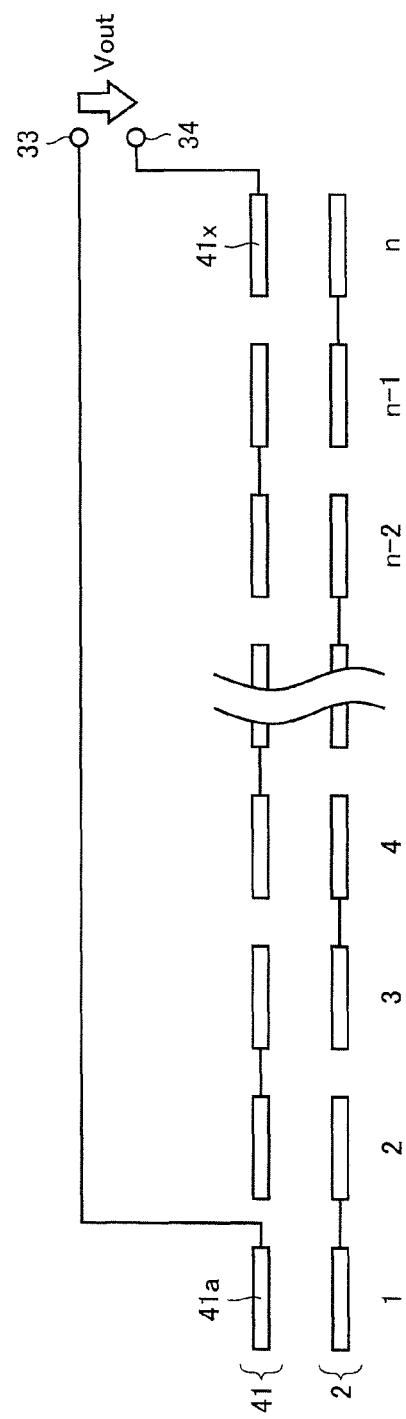
FIG. 29 is a diagram schematically illustrating the output-side structure of a piezoelectric transformer for the case of a general integer n.

In the piezoelectric transformer, the one to n output-side intermediate electrode pieces include one or more output-side intermediate electrode piece pairs in which two electrode pieces are electrically connected to each other and the one to n output electrode pieces includes one or more output electrode piece pairs in which two electrode pieces are electrically connected to each other. With respect to the one or more output electrode piece pairs and the one or more output-side intermediate electrode piece pairs, an electrical connection between electrode pieces belonging to one pair and a geometrical connection resulting from electrode pieces belonging to different pairs being superposed with each other in the thickness direction repeat in an alternating manner, and thus the one or more output-side intermediate electrode piece pairs and the one or more output electrode piece pairs are serially arrayed in an alternating manner. FIG. 29 illustrates this relationship for a general integer n. In this example, the number of vibration portions is n. The output electrode 2 is divided into n output electrode pieces. The output-side intermediate electrode 41 is divided into n output-side intermediate electrode pieces. In FIG. 29, the numbers 1, 2, 3, . . . , n−2, n−1, and n are illustrated at the bottom of the figure for convenience of explanation.

The two ends of the chain in which the output-side intermediate electrode piece pairs and the output electrode piece pairs are serially arrayed such that the above-described electrical connection and geometrical connection repeat in an alternating manner are preferably constituted by a first terminal output-side intermediate electrode piece and a second terminal output-side intermediate electrode piece that belong to the group consisting of the one to n output-side intermediate electrode pieces. In the example illustrated in FIG. 29, the output-side intermediate electrode piece 41a corresponds to the first terminal output-side intermediate electrode piece and the output-side intermediate electrode piece 41x corresponds to the second terminal output-side intermediate electrode piece. In the case where the input side is the side far from the base 1 and the output side is the side close to the base 1, if the two ends of the chain described above belong to the group consisting of the one to n output-side intermediate electrode pieces, the pad electrodes for extracting the output voltage are positioned a little further away from the base 1, and therefore the output voltage is more easily extracted.

Regarding all of the embodiments described above, it is preferable that the impedances be different in the material of the first piezoelectric layer 3 and the material of the second piezoelectric layer 5. In this case, it is easy to make the impedances different on the input side and the output side, and the desired transformation ratio can be easily realized.

In each of the above-described embodiments, an example is described in which the first piezoelectric layer 3 is formed of an AlN film and the second piezoelectric layer 5 is formed of a PZT film, but this selection and combination of materials is merely an example and different materials may be used for either or both of the first piezoelectric layer 3 and the second piezoelectric layer 5. Provided that the impedance of the material of the second piezoelectric layer 5 is lower than the impedance of the material of the first piezoelectric layer 3, similar effects to those described above would be expected. Here, embodiments have been described in which the second piezoelectric layer 5 is used for input, the first piezoelectric layer 3 is used for output, and it is assumed that the piezoelectric transformer is to be used for voltage boosting, but if the materials used for the first piezoelectric layer 3 and the second piezoelectric layer 5 are reversed, the piezoelectric transformer can be instead used for voltage lowering.

In addition, in each of the above-described embodiments, the piezoelectric layer on the side close to the base is used for output and the piezoelectric layer on the side far from the base is used for input, but this arrangement may be reversed.

In each of the above-described embodiments, a vibration film has been described as being a film that is arranged so as to completely close the opening 8 of the base 1. The vibration film includes the vibration portion assembly 9. The part of the upper layer 15 that is superposed with the base 1 will be referred to as a "base-covering upper layer" hereafter. The part of the upper layer 15 constituting the vibration portion assembly 9 is connected to the base-covering upper layer along the entire outer periphery of the vibration portion assembly 9, but this is merely an example and the present invention is not limited to this configuration. The vibration portion assembly 9 and the base-covering upper layer of the upper layer 15 may be connected to each other via a limited part. Part of the outer periphery of the vibration portion assembly 9 may be formed of a slit such that the vibration portion assembly 9 and the base-covering upper layer are separated from each other. The vibration portion assembly 9 and the base-covering upper layer may be connected to each other via a bridge-shaped part. Two or more bridge-shaped parts may be provided in order to support one vibration portion assembly 9.

In each of the above-described embodiments, the opening 8 is described as being a through hole, but the opening 8 is not limited to being a through hole. The base 1 surrounding the opening 8 is not limited to having a closed loop shape that is completely connected all the way around the opening 8 in a plan view, and a structure may instead be adopted in which the base 1 is cut partway therealong as in a C shape or a U shape.

In each of the above-described embodiments, an example has been described in which a voltage is applied to all of the n vibration portions that are present, but one or more vibration portions to which a voltage is not applied may be mixed in with the n vibration portions that are present, for example. Input electrode pieces may not be formed for the vibration portions to which a voltage is not applied. Vibration portions for which corresponding input electrode pieces are provided but for which wiring lines are not connected to the input electrode pieces may also be mixed in. Thus, in the case where vibration portions to which a voltage is not are mixed in, although the electrical characteristics are degraded compared with the case where such vibration portions are not mixed in, provided that the piezoelectric transformer is capable of operating as a whole, effects of a certain level can be obtained.

This applies not only to the input side but also to the output side. In each of the above-described embodiments, although a voltage is extracted from all of the vibration portions, for example, one or more vibration portions from which a voltage is not extracted may be mixed in with the n vibration portions that are present. Output electrode pieces may not be formed for the vibration portions from which a voltage is not extracted. Vibration portions for which corresponding output electrode pieces are provided but for which wiring lines are not connected to the output electrode pieces may also be mixed in. Thus, in the case where vibration portions from which a voltage is not extracted are mixed in, although the electrical characteristics are degraded compared with the case where such vibration portions are not mixed in, provided that the piezoelectric transformer can operate overall, effects of a certain level can be obtained.

These changes are to be selected as appropriate depending on the required electrical characteristics. A plurality of the above-described embodiments may be combined with each other as appropriate.

In addition, the presently disclosed embodiments are illustrative in all points and are not limiting. The scope of the present invention is to be defined by the scope of the claims and equivalents to the scope of the claims and all changes within the scope of the claims are to be included within the scope of the present invention.

REFERENCE SIGNS LIST 1 base,
2 output electrode,
2a, 2b, 2c, 2d output electrode piece,
3 first piezoelectric layer,
5 second piezoelectric layer,
6 input electrode,
6a, 6b, 6c, 6d input electrode piece,
8 opening,
9 vibration portion assembly,
9a, 9b, 9c, 9d vibration portion,
10 intermediate insulating layer,
15 upper layer,
30 phase inverter,
31, 32, 33, 34, 35, 37 pad electrode,
36 input terminal,
41 output-side intermediate electrode,
41a, 41b, 41c, 41d output-side intermediate electrode piece,
42 input-side intermediate electrode,
42a, 42b, 42c, 42d input-side intermediate electrode piece,
101, 102, 103, 104 piezoelectric transformer.

The invention claimed is:

1. A piezoelectric transformer comprising:
a base; and
an upper layer that is supported by the base;
wherein the upper layer includes a vibration portion assembly corresponding to a part of the upper layer that is not superposed with the base,
the vibration portion assembly includes an output electrode, an output-side intermediate electrode, an input-side intermediate electrode, and an input electrode, which are arranged separated from each other in a thickness direction and sequentially arrayed in the thickness direction,
when n is an integer greater than or equal to 3,
the vibration portion assembly includes n vibration portions arrayed in a first direction,
the upper layer includes a first piezoelectric layer interposed between the output electrode and the output-side intermediate electrode in at least the n vibration portions and a second piezoelectric layer superposed with the first piezoelectric layer and interposed between the input-side intermediate electrode and the input electrode in at least the n vibration portions,
the input electrode includes one to n input electrode pieces that are arrayed so as to correspond to at least one vibration portion among the n vibration portions,
the output electrode includes one to n output electrode pieces that are arrayed so as to correspond to the at least one vibration portion among the n vibration portions,
the output-side intermediate electrode includes one to n output-side intermediate electrode pieces that are arrayed so as to correspond to the at least one vibration portion among the n vibration portions,
the first piezoelectric layer is polarized in a first fixed direction throughout the n vibration portions,
the second piezoelectric layer is polarized in a second fixed direction throughout the n vibration portions,
when the n vibration portions are referred to as first to nth vibration portions from a first side to a second side of the piezoelectric transformer in the first direction,
wiring lines arranged such that voltages of opposite phases, with a potential of the input-side intermediate electrode serving as a reference potential, can be respectively applied to a first input electrode piece group and a second input electrode piece group, the first input electrode piece group comprising one or more of the input electrode pieces corresponding to odd-numbered vibration portions, and the second input electrode piece group comprising one or more of the input electrode pieces corresponding to even-numbered vibration portions, the one to n output electrode pieces include a first output electrode piece and a second output electrode piece that are electrically connected to each other, the one to n output-side intermediate electrode pieces include a first output-side intermediate electrode piece and a second output-side intermediate electrode piece that are electrically connected to each other, and the second output electrode piece and the first output-side intermediate electrode piece are superposed with each other in the thickness direction, the first output electrode piece is not superposed with the first output-side intermediate electrode piece or the second output-side intermediate electrode piece in the thickness direction, and the second output-side intermediate electrode piece is not superposed with the first output electrode piece or the second output electrode piece in the thickness direction.

2. The piezoelectric transformer according to claim 1, wherein the one to n output electrode pieces include a third output electrode piece and a fourth output electrode piece that are electrically connected to each other, the third output electrode piece and the second output electrode piece are insulated from each other, and the third output electrode piece and the second output-side intermediate electrode piece are superposed with each other in the thickness direction, and the fourth output electrode piece is not superposed with the first output-side intermediate electrode piece or the second output-side intermediate electrode piece in the thickness direction.

3. The piezoelectric transformer according to claim 2, wherein the one to n output electrode pieces include a fifth output electrode piece and a sixth output electrode piece that are electrically connected to each other, the fifth output electrode piece and the second output electrode piece are insulated from each other, the fifth output electrode piece and the fourth output electrode piece are insulated from each other, the one to n output-side intermediate electrode pieces include a third output-side intermediate electrode piece and a fourth output-side intermediate electrode piece that are electrically connected to each other, the third output-side intermediate electrode piece and the second output-side intermediate electrode piece are insulated from each other, the fourth output electrode piece and the third output-side intermediate electrode piece are superposed with each other in the thickness direction, and the fifth output electrode piece and the fourth output-side intermediate electrode piece are superposed with each other in the thickness direction, and the sixth output electrode piece is not superposed with any of the first to fourth output-side intermediate electrode pieces in the thickness direction.

4. The piezoelectric transformer according to claim 1, wherein the one to n output-side intermediate electrode pieces include one or more output-side intermediate electrode piece pairs in which two output-side intermediate electrode pieces are electrically connected to each other, the one to n output electrode pieces include one or more output electrode piece pairs in which two output electrode pieces are electrically connected to each other, and wherein the one or more output-side intermediate electrode piece pairs and the one or more output electrode piece pairs are serially arrayed in an alternating manner.

5. The piezoelectric transformer according to claim 4, wherein two ends of a chain in which the one or more output-side intermediate electrode piece pairs and the one or more output electrode piece pairs are serially arrayed in the alternating manner are comprised of a first terminal output-side intermediate electrode piece and a second terminal output-side intermediate electrode piece of the one to n output-side intermediate electrode pieces.

6. The piezoelectric transformer according to claim 1, wherein a first impedance of a material of the first piezoelectric layer is different than a second impedance of a material of the second piezoelectric layer.

7. A piezoelectric transformer comprising:
a base; and
an upper layer that is supported by the base;
wherein the upper layer includes a vibration portion assembly corresponding to a part of the upper layer that is not superposed with the base, the vibration portion assembly includes an output electrode, an output-side intermediate electrode, an input-side intermediate electrode, and an input electrode, which are arranged separated from each other in a thickness direction and sequentially arrayed in the thickness direction, when n is an integer greater than or equal to 3, the vibration portion assembly includes n vibration portions arrayed in a first direction, the upper layer includes a first piezoelectric layer interposed between the output electrode and the output-side intermediate electrode in at least the n vibration portions and a second piezoelectric layer superposed with the first piezoelectric layer and interposed between the input-side intermediate electrode and the input electrode in at least the n vibration portions, the input electrode includes one to n input electrode pieces that are arrayed in a divided manner so as to correspond to at least some of the n vibration portions, the output electrode includes one to n output electrode pieces that are arrayed in a divided manner so as to correspond to the at least some of the n vibration portions, the output-side intermediate electrode includes one to n output-side intermediate electrode pieces that are arrayed in a divided manner so as to correspond to the at least some of the n vibration portions, when the n vibration portions are referred to as first to nth vibration portions from a first side to a second side of the piezoelectric transformer in the first direction, the first piezoelectric layer is polarized in a fixed direction throughout the n vibration portions, the second piezoelectric layer has one to n polarization regions that correspond to the at least some of the n vibration portions, and of the one to n polarization regions, a first polarization region group corresponding to odd-numbered vibration portions and a second polarization region group corresponding to even-numbered vibration portions are polarized in opposite directions, wiring lines arranged such that voltages of a same phase can be applied to the one to n input electrode pieces with the potential of the input-side intermediate electrode serving as a reference potential, the one to n output electrode pieces include a first output electrode piece and a second output electrode piece that are electrically connected to each other, the one to n output-side intermediate electrode pieces include a first output-side intermediate electrode piece and a second output-side intermediate electrode piece that are electrically connected to each other, and the second output electrode piece and the first output-side intermediate electrode piece are superposed with each other in the thickness direction, the first output electrode piece is not superposed with the first output-side intermediate electrode piece or the second output-side intermediate electrode piece in the thickness direction, and the second output-side intermediate electrode piece is not superposed with the first output electrode piece or the second output electrode piece in the thickness direction.

8. The piezoelectric transformer according to claim 7, wherein the one to n output electrode pieces include a third output electrode piece and a fourth output electrode piece that are electrically connected to each other, the third output electrode piece and the second output electrode piece are insulated from each other, and the third output electrode piece and the second output-side intermediate electrode piece are superposed with each other in the thickness direction, and the fourth output electrode piece is not superposed with the first output-side intermediate electrode piece or the second output-side intermediate electrode piece in the thickness direction.

9. The piezoelectric transformer according to claim 8, wherein the one to n output electrode pieces include a fifth output electrode piece and a sixth output electrode piece that are electrically connected to each other, the fifth output electrode piece and the second output electrode piece are insulated from each other, the fifth output electrode piece and the fourth output electrode piece are insulated from each other, the one to n output-side intermediate electrode pieces include a third output-side intermediate electrode piece and a fourth output-side intermediate electrode piece that are electrically connected to each other, the third output-side intermediate electrode piece and the second output-side intermediate electrode piece are insulated from each other, the fourth output electrode piece and the third output-side intermediate electrode piece are superposed with each other in the thickness direction, and the fifth output electrode piece and the fourth output-side intermediate electrode piece are superposed with each other in the thickness direction, and the sixth output electrode piece is not superposed with any of the first to fourth output-side intermediate electrode pieces in the thickness direction.

10. The piezoelectric transformer according to claim 7, wherein the one to n output-side intermediate electrode pieces include one or more output-side intermediate electrode piece pairs in which two output-side electrode pieces are electrically connected to each other, the one to n output electrode pieces include one or more output electrode piece pairs in which two output electrode pieces are electrically connected to each other, and wherein the one or more output-side intermediate electrode piece pairs and the one or more output electrode piece pairs are serially arrayed in an alternating manner.

11. The piezoelectric transformer according to claim 10, wherein two ends of a chain in which the one or more output-side intermediate electrode piece pairs and the one or more output electrode piece pairs are serially arrayed in the alternating manner are comprised of a first terminal output-side intermediate electrode piece and a second terminal output-side intermediate electrode piece of the one to n output-side intermediate electrode pieces.

12. The piezoelectric transformer according to claim 7, wherein a first impedance of a material of the first piezoelectric layer is different than a second impedance of a material of the second piezoelectric layer.

13. A piezoelectric transformer comprising:

a base; and an upper layer that is supported by the base;

wherein the upper layer includes a vibration portion assembly corresponding to a part of the upper layer that is not superposed with the base, the vibration portion assembly includes an output electrode, an output-side intermediate electrode, an input-side intermediate electrode, and an input electrode, which are arranged separated from each other in a thickness direction and sequentially arrayed in the thickness direction, the vibration portion assembly includes first and second vibration portions that are arrayed in a first direction, the upper layer includes a first piezoelectric layer interposed between the output electrode and the output-side intermediate electrode in the first and second vibration portions and a second piezoelectric layer superposed with the first piezoelectric layer and interposed between the input-side intermediate electrode and the input electrode in the first and second vibration portions, the input electrode includes first and second input electrode pieces that are arrayed so as to correspond to the first and second vibration portions, the output electrode includes first and second output electrode pieces that are arrayed so as to correspond to the first and second vibration portions, the first piezoelectric layer is polarized in a fixed direction throughout the first and second vibration portions, the second piezoelectric layer is polarized in a fixed direction throughout the first and second vibration portions, wiring lines arranged such that voltages of opposite phases can be respectively applied to the first input electrode piece and the second input electrode piece with a potential of the input-side intermediate electrode serving as a reference potential, the output-side intermediate electrode includes a first output-side intermediate electrode piece and a second output-side intermediate electrode piece, and the first output electrode piece and the first output-side intermediate electrode piece are superposed with each other in a thickness direction, and the second output electrode piece and the second output-side intermediate electrode piece are superposed with each other in the thickness direction.

14. The piezoelectric transformer according to claim 13, wherein a first impedance of a material of the first piezoelectric layer is different than a second impedance of a material of the second piezoelectric layer.

15. A piezoelectric transformer comprising:
a base; and
an upper layer that is supported by the base;
wherein the upper layer includes a vibration portion assembly corresponding to a part of the upper layer that is not superposed with the base,
the vibration portion assembly includes an output electrode, an output-side intermediate electrode, an input-side intermediate electrode, and an input electrode, which are arranged separated from each other in a thickness direction and sequentially arrayed in the thickness direction,
the vibration portion assembly includes first and second vibration portions that are arrayed in a first direction,
the upper layer includes a first piezoelectric layer interposed between the output electrode and the output-side intermediate electrode in the first and second vibration portions and a second piezoelectric layer superposed with the first piezoelectric layer and interposed between the input-side intermediate electrode and the input electrode in the first and second vibration portions,
the input electrode includes first and second input electrode pieces that are arrayed so as to correspond to the first and second vibration portions,
the output electrode includes first and second output electrode pieces that are arrayed so as to correspond to the first and second vibration portions,
the first piezoelectric layer is polarized in a fixed direction throughout the first and second vibration portions,
the second piezoelectric layer is polarized so as to have opposite polarization directions in the first vibration portion and the second vibration portion,
wiring lines arranged such that voltages of the same phase can be applied to the first input electrode piece and the second input electrode piece with a potential of the input-side intermediate electrode serving as a reference potential,
the output-side intermediate electrode includes a first output-side intermediate electrode piece and a second output-side intermediate electrode piece, and
the first output electrode piece and the first output-side intermediate electrode piece are superposed with each other in the thickness direction, and the second output electrode piece and the second output-side intermediate electrode piece are superposed with each other in the thickness direction.

16. The piezoelectric transformer according to claim 15, wherein a first impedance of a material of the first piezoelectric layer is different than a second impedance of a material of the second piezoelectric layer.

* * * * *